(12) United States Patent
Ikeda

(10) Patent No.: US 9,247,684 B2
(45) Date of Patent: Jan. 26, 2016

(54) OBJECT CONTROL SYSTEM, OBJECT CONTROL METHOD AND PROGRAM, AND ROTATIONAL CENTER POSITION SPECIFICATION DEVICE

(75) Inventor: Masaaki Ikeda, Brookline, MA (US)

(73) Assignee: Cognex Corporation, Natick, MA (US)

( * ) Notice: Subject to any disclaimer, the term of this patent is extended or adjusted under 35 U.S.C. 154(b) by 359 days.

(21) Appl. No.: 13/501,660

(22) PCT Filed: Dec. 6, 2010

(86) PCT No.: PCT/US2010/059089
§ 371 (c)(1),
(2), (4) Date: Jun. 28, 2012

(87) PCT Pub. No.: WO2011/071813
PCT Pub. Date: Jun. 16, 2011

(65) Prior Publication Data
US 2012/0262626 A1    Oct. 18, 2012

(30) Foreign Application Priority Data

Dec. 7, 2009   (JP) .................................. 2009-278033

(51) Int. Cl.
*H04N 5/225* (2006.01)
*H05K 13/00* (2006.01)

(52) U.S. Cl.
CPC ................................. *H05K 13/0015* (2013.01)

(58) Field of Classification Search
CPC ............ H04N 1/00819; H04N 5/2178; H04N 13/0246
USPC ......................................................... 348/373
See application file for complete search history.

(56) References Cited

U.S. PATENT DOCUMENTS

2003/0209679 A1    11/2003   Kodama

FOREIGN PATENT DOCUMENTS

JP        2000277991 A    10/2000
JP        2006049755 A    2/2006

*Primary Examiner* — Roberto Velez
*Assistant Examiner* — Stephen Coleman
(74) *Attorney, Agent, or Firm* — Loginov & Associates

(57) ABSTRACT

An object control system prevents shifting an object to a target position from requiring a long time, even if, for example, the position of installation of an image capturing unit is deviated. And, according to the present invention, an object control system includes: a first image capturing unit that captures a first image including a first reference mark that specifies a first object line determined in advance with respect to an object; an angle acquisition unit that, on the basis of said first reference mark within said first image, acquires a first differential angle that specifies the angle between a first target object line, determined in advance with respect to said first image, and said first object line; and an object control unit that controls a rotation mechanism that rotates said object, on the basis of said first differential angle.

15 Claims, 14 Drawing Sheets

| stage coordinate system | pixel coordinate system |
|---|---|
| (X1,Y1) | (x1,y1) |
| (X2,Y2) | (x2,y2) |
| (X3,Y3) | (x3,y3) |
| (X4,Y4) | (x4,y4) |
| (X5,Y5) | (x5,y5) |
| (X6,Y6) | (x6,y6) |
| (X7,Y7) | (x7,y7) |
| (X8,Y8) | (x8,y8) |
| (X9,Y9) | (x9,y9) |

Fig. 5

OBJECT CONTROL SYSTEM, OBJECT CONTROL METHOD AND PROGRAM, AND ROTATIONAL CENTER POSITION SPECIFICATION DEVICE

FIELD OF THE INVENTION

The present invention relates to an object control system, to an object control method and program, and to a rotational center position specification device.

BACKGROUND OF THE INVENTION

In Japanese Patent 3,531,674, a position determination device is disclosed that determines the position of a body that is a subject for positional determination. While shifting a table upon which said subject body is mounted, this position determination device captures, with at least one camera, images that include marks provided upon said subject body. Then, using these images, the position determination device calculates the amounts of deviation between the positions of the marks and target positions for the marks, and rotates the table or shifts it parallel to itself until these deviations are eliminated. Furthermore, in Japanese Laid Open Patent Publication 2006 49755, a workpiece position determination device is disclosed that acquires the coordinates of a rotational center of a stage, which are needed for correcting rotational deviation of a workpiece. From images that have obtained by capturing images twice with two cameras, this workpiece position determination device measures coordinates that specify the positions of corresponding marks. And then the workpiece position determination device calculates the rotational angle of the stage by using shift amounts of the marks that have been acquired from their coordinates and from the distance between the marks which is inputted in advance, and calculates the coordinates of the rotational center of the stage by using this rotational angle and the coordinates of the marks. And, in Japanese Laid Open Patent Publication Heisei 5 48295, an electronic component installation device is disclosed that installs chip type electronic components in predetermined positions upon an electronic circuit board. With this electronic component installation device, the attitude of an electronic component is corrected by rotating a suction nozzle on the basis of positional data for the suction nozzle inputted in advance, and position data for the reference position of the electronic component acquired on the basis of an image captured by a camera.

SUMMARY OF THE INVENTION

Problems to be Solved by the Invention

However, with the device described in Japanese Patent 3,531,674, sometimes it happens that the table must be rotated or shifted parallel to itself numerous times, until the deviations between the positions of the marks and their target positions are cancelled. And with the devices described in Japanese Laid Open Patent Publication 2006 49755 or Japanese Laid Open Patent Publication Heisei 5 48295, if for example the position in which an image capturing unit is installed is not quite correct, then sometimes it may happen that it is not possible to correct the attitude of the electronic components easily, or that errors appear in the coordinates of the rotational center of the stage, so that it takes a long time to shift the object to its target position. Thus there is a demand for an object control system that can ensure that a long time period is not required for shifting the object to its target position, even if for example the position in which an image capturing unit is installed is not quite correct.

Means for Solving the Problems

In order to solve the problems described above, an object control system according to one aspect of the present invention comprises: an image acquisition unit that acquires a first image from a first image capturing unit that captures said first image including a first reference mark that specifies a first object line determined in advance with respect to an object; an angle acquisition unit that, on the basis of said first reference mark within said first image, acquires a first differential angle that specifies the angle between a first target object line, determined in advance with respect to said first image, and said first object line; and an object control unit that controls a rotation mechanism that rotates said object, on the basis of said first differential angle.

In the object control system described above: the image acquisition unit may acquire a second image from a second image capturing unit that captures said second image including a second reference mark that specifies a second object line determined in advance with respect to said object; said angle acquisition unit further, on the basis of said second reference mark within said second image, may acquire a second differential angle that specifies the angle between a second target object line, determined in advance with respect to said second image, and said second object line; and said object control unit may control said rotation mechanism on the basis of said second differential angle.

In the object control system described above, there may be further included a weighting storage unit that stores respective weightings for said first image capturing unit and said second image capturing unit; and: for said first differential angle and said second differential angle, a weighting for said first image capturing unit and a weighting for said second image capturing unit are respectively assigned, and said rotation mechanism is controlled on the basis of said first differential angle and said second differential angle to which said respective weightings have been assigned.

In the object control system described above, the resolving powers of said first image capturing unit and said second image capturing unit may be different, and said weighting storage unit may store respective weightings for said first image capturing unit and said second image capturing unit, so that the one thereof whose resolving power is the higher has a higher weighting value than the one thereof whose resolving power is the lower.

In the object control system described above: said object control unit may further control a parallel shifting mechanism that shifts said object parallel to itself, and said object control unit: may specify a first parallel shift amount for said object on the basis of said first reference mark and a first target reference mark that is determined in advance for said first image; may specify a second parallel shift amount for said object on the basis of said second image and a second target reference mark that is determined in advance with respect to said second image; may assign a weight to said first image capturing unit and a weight to said second image capturing unit for said first parallel shift amount and said second parallel shift amount, respectively; and may control said parallel shifting mechanism on the basis of said first parallel shift amount and said second parallel shift amount to which said respective weightings have been assigned.

In the object control system described above, said first image capturing unit and said second image capturing unit may have different resolving powers due to having different resolutions.

In the object control system described above, said first image capturing unit and said second image capturing unit may have different resolving powers due to having different image capture ranges.

In the object control system described above, there may be further included a decision unit that makes a decision as to whether or not said first reference mark is included within said first image; and, if said first reference mark is not included within said first image, said object control unit may control said rotation mechanism on the basis of said second differential angle so that said first reference mark is included within said first image.

In the object control system described above, there may be further included a decision unit that makes a decision as to whether or not said first reference mark is included within said first image; and, if said first reference mark is not included within said first image, said object control unit may control said rotation mechanism so that said second angle is moved closer to a second target angle.

In the object control system described above, there may be further provided a calibration unit that specifies the rotational center position of a rotation mechanism that rotates a holding member upon which said object is held, and: said image acquisition unit may acquire, with said first image capturing unit, first mark images including a first mark that is set in advance with respect to said holding member; said calibration unit may acquire an isosceles triangle shape whose bottom edge is a straight line that connects the pixel X and Y coordinate values of the first marks that are respectively included in two said first mark images acquired by said image acquisition unit before said holding member is rotated by said rotation mechanism and after that rotation, and whose apical angle is an angle corresponding to the amount of rotation of said rotation mechanism, and may acquire said position of said rotational center on the basis of the position within the first mark image of the vertex of said apical angle of said isosceles triangle shape; and said object control unit may control said rotation mechanism on the basis of said rotational center position.

In the object control system described above, there may be further included a calibration unit that specifies the rotational center position of a rotation mechanism that rotates a holding member upon which said object is held, and: said image acquisition unit may acquire, with said first image capturing unit, images including at least a portion of said holding member; said calibration unit may comprise: a first rotational center position specification unit that specifies a position of a first rotational center of said rotation mechanism on the basis of positions of a first mark that is determined with respect to said holding member, included in said images before said holding member is rotated by said rotation mechanism and after that rotation; a second rotational center position specification unit that determines, on the basis of said position of the first rotational center, a position of a set rotational center that is closer to the image capturing range of said first image capturing unit than said position of the first rotational center, and that specifies a position of a second rotational center of said rotation mechanism on the basis of positions of a second mark that is determined with respect to said holding member, included in said images before said holding member is rotated by said rotation mechanism around said position of the set rotational center and after that rotation; and a rotational center position correction unit that corrects said position of the first rotational center on the basis of said position of the set rotational center and said position of the second rotational center; and said object control unit may control said rotation mechanism on the basis of said corrected position of the first rotational center.

In the object control system described above: said first rotational center position specification unit may specify said position of said first rotational center of said rotation mechanism on the basis of positions of said first mark included in said images before said holding member is rotated by said rotation mechanism around a rotational center position outside the image capture range of said first image capturing unit, and after that rotation; and said second rotational center position specification unit may specify said position of said second rotational center of said rotation mechanism on the basis of positions of said second mark included in said images before said holding member is rotated by said rotation mechanism around said position of the set rotational center that is included within the image capture range of said first image capturing unit, and after that rotation.

And a rotational center position specification device according to one aspect of the present invention specifies the rotational center position of a rotation mechanism that rotates a holding member that holds an object, and comprises: an image acquisition unit that acquires an image from an image capturing unit that captures said image including at least a portion of said holding member; a first rotational center position specification unit that specifies a position of a first rotational center of said rotation mechanism on the basis of positions of a first mark that is determined with respect to said holding member, included in said images before said holding member is rotated by said rotation mechanism and after that rotation; a second rotational center position specification unit that determines, on the basis of said position of the first rotational center, a position of a set rotational center that is closer to the image capturing range of said image capturing unit than said position of the first rotational center, and that specifies a position of a second rotational center of said rotation mechanism on the basis of positions of a second mark that is determined with respect to said holding member, included in said images before said holding member is rotated by said rotation mechanism around said position of the set rotational center and after that rotation; and a rotational center position correction unit that corrects said position of the first rotational center on the basis of said position of the set rotational center and said position of the second rotational center.

It should be understood that the above summary of the invention is not to be considered as being an enumeration of all of the necessary characteristics of the present invention. Moreover, sub-combinations of these groups of characteristics are also to be considered as being included in the scope of the present invention.

BRIEF DESCRIPTION OF THE DRAWINGS

FIG. 5 is a figure showing an example of a coordinate correspondence relationship table specifying the correspondence relationships between stage X and Y coordinate values held in a coordinate system correspondence relationship holding unit and pixel X and Y coordinate values;

DETAILED DESCRIPTION

In the following the present invention will be explained in terms of embodiments thereof; but the following embodiments are not to be considered as being limitative of the scope of the invention, which is to be defined by the scope of the Claims. Moreover, the combination of all of the distinguishing features explained in connection with these embodiments is not to be considered as being limitative of the means for implementation of the present invention, or as being essential thereto.

Figure 1:
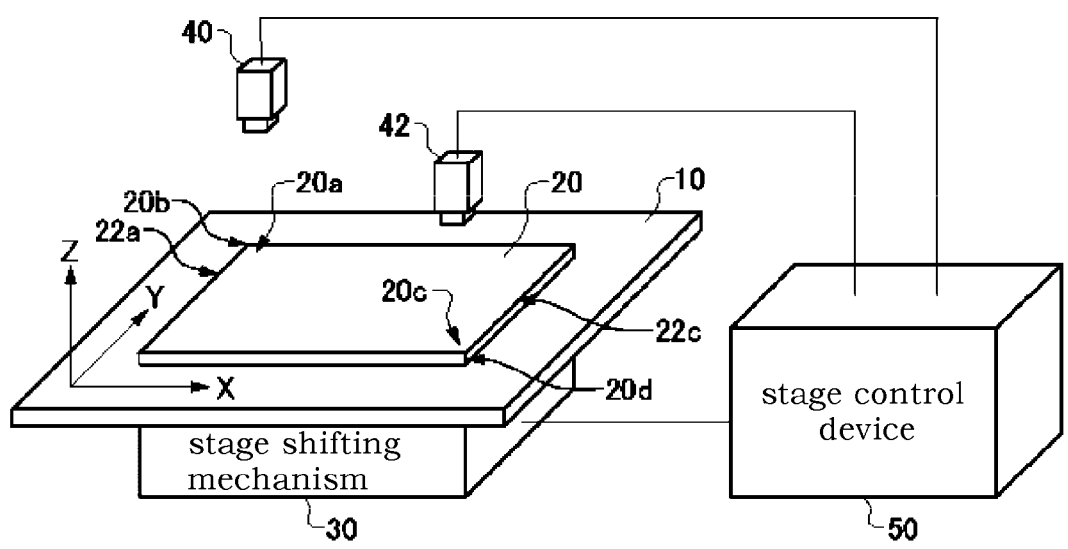
FIG. 1 is a figure showing an example of the structure of an object control system according to an embodiment of the present invention.

FIG. 1 is a figure showing an example of the structure of an object control system 100 according to an embodiment of the present invention. This object control system 100 comprises a stage 10, a stage shifting mechanism 30, a first image capturing unit 40, a second image capturing unit 42, and a stage control device 50.

The stage 10 functions as a holding member for holding an object 20, and the object 20 is installed upon the stage 10. The stage shifting mechanism 30 shifts the stage 10 in horizontal directions, in other words in the X and Y directions in FIG. 1, and also in the rotational direction, in which the stage 10 is displaced around the θ direction by being rotated around a rotational axis which is shown as the Z direction in FIG. 1.

The first image capturing unit 40 captures an image including one corner portion 20a of the object 20, as an image including a first reference mark that specifies a first object line determined in advance with respect to the object 20 upon the stage 10. In the following, the image captured by the first image capturing unit 40 will be termed the "first image."

The second image capturing unit 42 captures an image including another corner portion 20c of the object 20, as an image including a second reference mark that specifies a second object line determined in advance with respect to the object 20 upon the stage 10. In the following, the image captured by the second image capturing unit 42 will be termed the "second image."

The stage control device 50 functions as an object control unit that controls the shifting of the object 20, and, on the basis of the first reference mark within the first image and the second reference mark within the second image, controls the shifting of the stage 10 with the stage shifting mechanism 30 so as to shift the object 20 to a target position that is specified in advance.

With the object control system 100 according to this embodiment having the structure described above, even if it has not been possible to capture such an image including such a reference mark specified in advance with one of the first image capturing unit 40 and the second image capturing unit 42, it is still possible to shift the object 20 to the target position on the basis of the image that has been captured by the other one of these image capturing units.

It should be understood that, in this embodiment, an example is explained in which shifting of the object 20 is performed by shifting the stage 10 in the horizontal direction and in the rotational direction. However, this shifting of the object 20 could also be performed without necessarily shifting the stage 10. For example, it would be acceptable to arrange to suck the object 20 loaded upon the stage 10 down against a suction device which is installed above the stage 10, and to shift the object 20 by shifting this suction device in the horizontal direction or in the rotational direction.

Figure 2A:
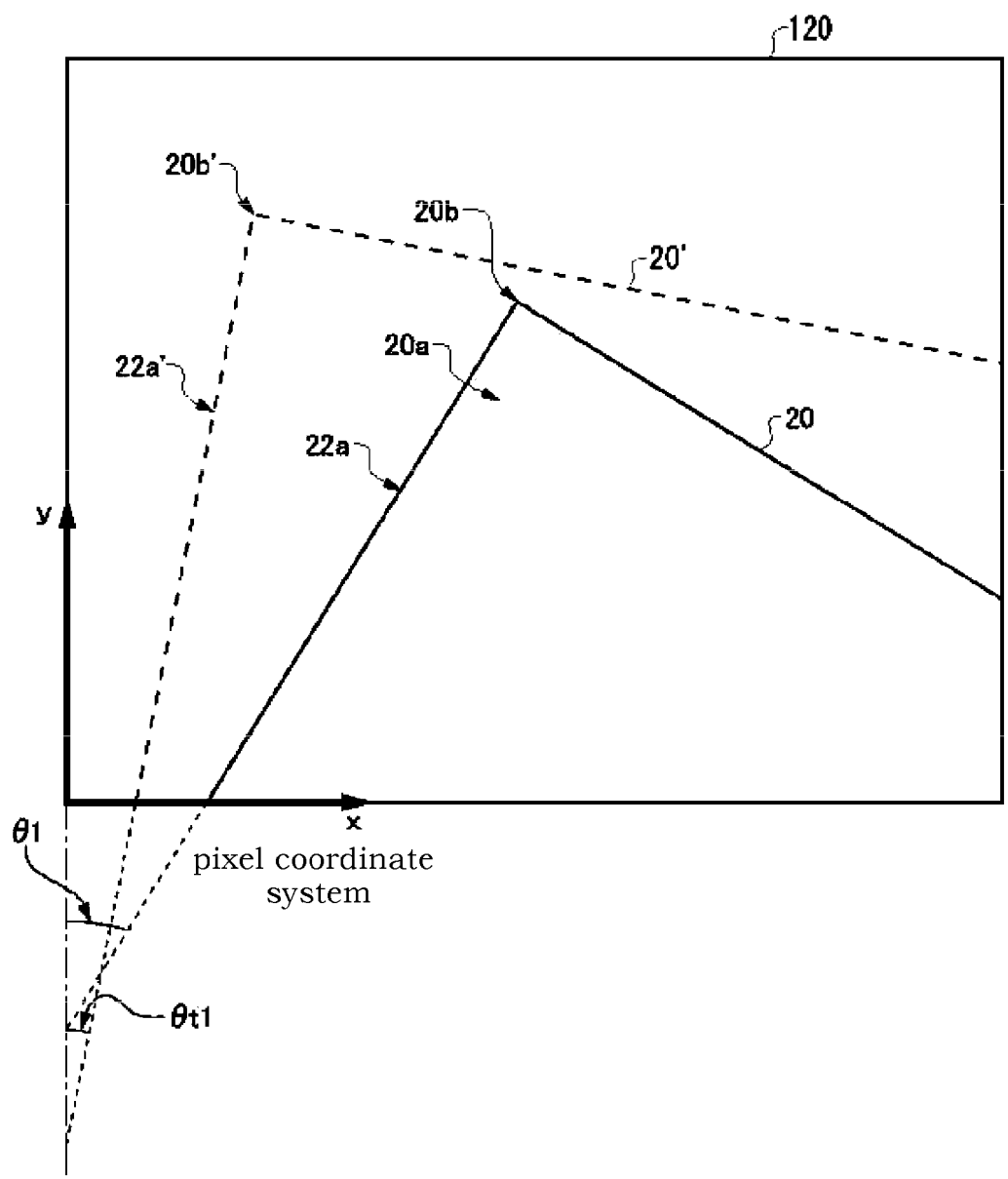
FIG. 2A is a figure for explanation of a first object line and a first reference point, when some corner portion of an object is used as a first reference mark.

FIG. 2A shows an example of a first object line in the first image 120 that specifies the inclination of the object 20, when the corner portion 20a of the object 20 is used as the first reference mark. In this embodiment, one side 22a of the corner portion 20a corresponds to the first object line. Furthermore, the angle between this first object line, in other words the side 22a, and the Y axis of a first pixel coordinate system is expressed as a first angle θ1. Moreover, in this embodiment, the vertex 20b of the corner portion 20a corresponds to a first reference point that specifies the position of the object 20 in the first pixel coordinate system within the first image. It should be understood that, in FIG. 2A, the object 20' shown by the broken line represents the position within the first image of the object 20 at its target position. Here, the corner portion 20a' of the object 20' specifies a first target reference mark. Moreover, one side 22a' of the corner portion 20a' specifies a first target object line, and the vertex 20b' of the corner portion 20a' specifies a first target reference point. And the angle between the first target object line and the Y axis is expressed as a first target angle θt1.

Figure 2B:
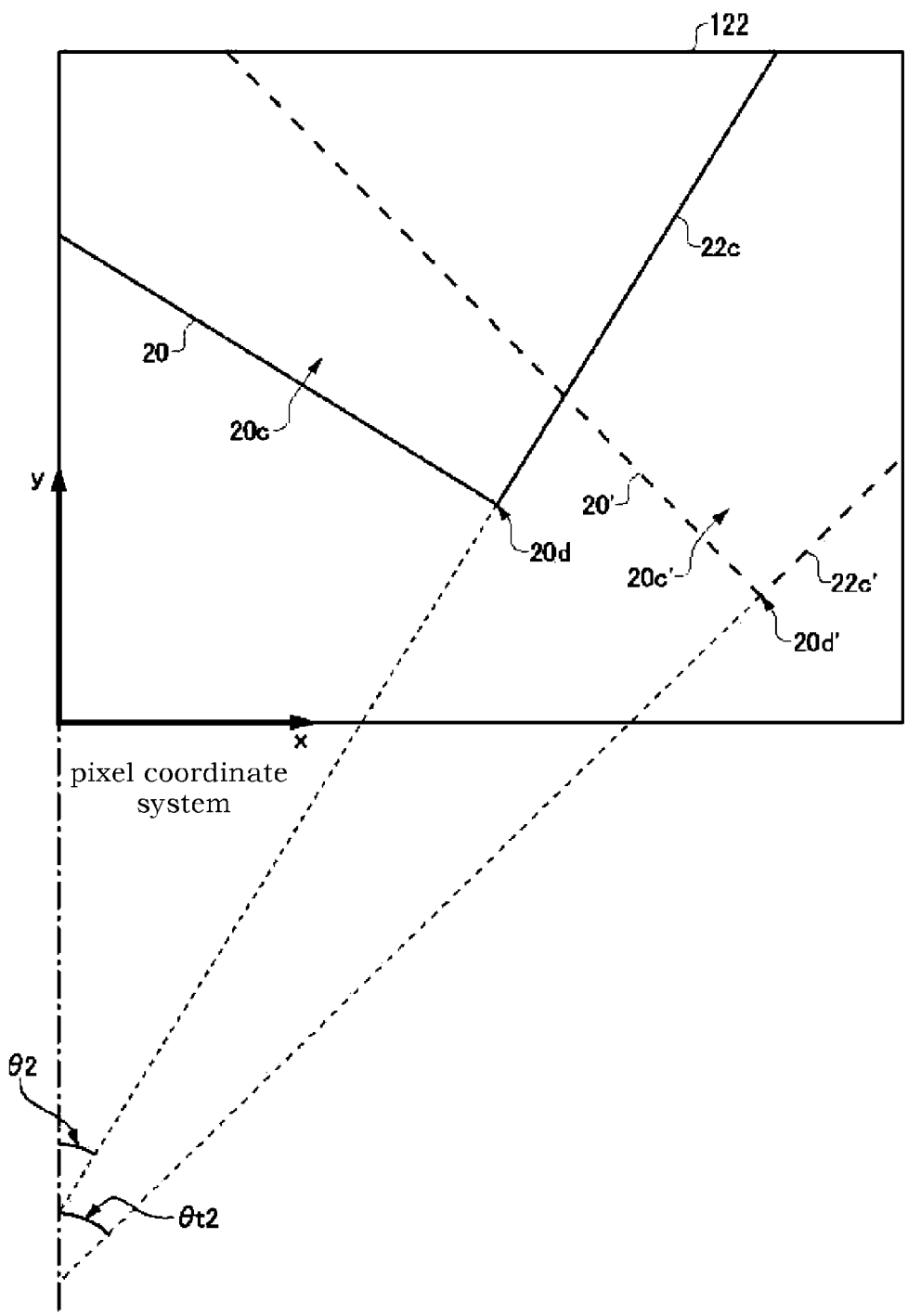
FIG. 2B is a figure for explanation of a second object line and a second reference line, when some corner portion of the object is used as a second reference mark.

FIG. 2B shows an example of a second object line in the second image 122 that specifies the inclination of the object 20, when the corner portion 20c of the object 20 is used as the second reference mark. In this embodiment, one side 22c of the corner portion 20c corresponds to the second object line. Furthermore, the angle between this second object line, in other words the side 22c, and the Y axis of a second pixel coordinate system is expressed as a second angle θ2. Moreover, in this embodiment, the vertex 20d of the corner portion 20c corresponds to a second reference point that specifies the position of the object 20 in the second pixel coordinate system within the second image. It should be understood that, in FIG. 2B, the object 20' shown by the broken line represents the position within the second image of the object 20 at its target position. Here, the corner portion 20c' of the object 20' specifies a second target reference mark. Moreover, one side 22c' of the corner portion 20c' specifies a second target object line, and the vertex 20d' of the corner portion 20c' specifies a second target reference point. And the angle between the second target object line and the Y axis is expressed as a second target angle θt2.

On the basis of the first image and the second image, the stage control device 50 according to this embodiment controls the stage shifting mechanism 30 so as to move the current position of the object 20 in the first pixel coordinate system in the first image and the current position of the object 20 in the second pixel coordinate system in the second image, closer to the target position of the object 20 within the first image, which is acquired in advance, and to the target position of the object within the second image, which is likewise acquired in advance.

In more concrete terms, the stage control device 50 acquires the angle between the first object line as specified by the first reference mark in the first image, and the first target object line that has been specified in advance, and the angle between the second object line as specified by the second reference mark in the second image, and the second target object line that has been specified in advance. In the following, this angle between the first object line and the first target object line that has been specified in advance will be termed the "first differential angle." Moreover, this angle between the second object line and the second target object line that has been specified in advance will be termed the "second differential angle."

On the basis of the above first differential angle and second differential angle, the stage control device 50 acquires, as a target rotational amount, the rotational amount for the stage 10 that is required for shifting the object 20 to its target position. In more concrete terms, in this embodiment, as the target rotational amount, the stage control device 50 acquires an average differential angle that is given by the average of the first differential angle and the second differential angle.

Furthermore, the stage control device 50 acquires X and Y coordinate values in the first pixel coordinate system when the first reference point in the first image specified by the first reference mark has been rotated by just this target rotational amount, and first differential X and Y coordinate values that are given by the differences thereof from the X and Y coordinate values in the first pixel coordinate system of the first target reference point in the first image. In a similar manner, the stage control device 50 acquires X and Y coordinate values in the second pixel coordinate system when the second reference point in the second image specified by the second reference mark has been rotated by just this target rotational amount, and second differential X and Y coordinate values that are given by the differences thereof from the X and Y coordinate values in the second pixel coordinate system of the second target reference point in the second image. Next, on the basis of these first differential pixel X and Y coordinate values and these second differential pixel X and Y coordinate values, the stage control device 50 acquires, as a target shift amount in the X direction and a target shift amount in the Y direction, the amount for shifting the stage 10 parallel to itself in the X direction and the amount for shifting it parallel to itself in the Y direction, that are required in order to shift the object 20 to the target position. In more concrete terms, in this embodiment, the stage control device 50 specifies first parallel shift amounts in the X direction and in the Y direction on the basis of the first differential X and Y coordinate values, specifies second parallel shift amounts in the X direction and in the Y direction on the basis of the second differential X and Y coordinate values, and acquires a target shift amount in the X direction and a target shift amount in the Y direction by calculating the averages of these parallel shift amounts in each of the X direction and the Y direction.

And the stage control device 50 shifts the object 20 to its target position by controlling the stage shifting mechanism 30 on the basis of the target rotational amount, the target shift amount in the X direction, and the target shift amount in the Y direction, all of which have been acquired as described above.

It should be understood that, in this embodiment, an example is explained in which certain corner portions of the object 20 are used as the first reference mark and the second reference mark. However, the first reference mark and the second reference mark may be any marks in their respective images from which the inclination of the object 20 can be acquired. Accordingly, the first reference mark and the second reference mark may also be marks exhibiting angles that are affixed to the object 20 in advance. Furthermore, the first reference mark and the second reference mark may also consist of two points, each of which is affixed to the object 20 in advance. That is, the straight line that joins these two points may constitute the object line, while one or the other of these two points may constitute the reference point. In other words, the object line may also be a virtual line which is determined in advance with respect to the reference mark, but which is not actually visible. It would also be acceptable for the object line to be a reference axis that is determined in advance with respect to the reference mark, for example a virtual line that is determined in advance with respect to the rotational axis so that the moment of inertia of the reference mark is minimized. Moreover, the object line could also be a virtual line that is determined in advance on the basis of a coordinate system that is determined in advance with respect to the object 20.

Furthermore, in this embodiment, an example is explained in which marks in different positions upon the object 20 constitute the first reference mark and the second reference mark. In other words, an example is explained in which the first image capturing unit 40 and the second image capturing unit 42 capture images in different positions upon the object 20. However, it would also be acceptable for the first reference mark and the second reference mark not to be constituted by marks in different positions upon the object 20. In other words, it would be acceptable for the first reference mark and the second reference mark to be constituted by marks in the same position upon the object 20. Accordingly, it would be acceptable for the first image capturing unit 40 and the second image capturing unit 42 to capture images of the same position upon the object 20.

Figure 3:
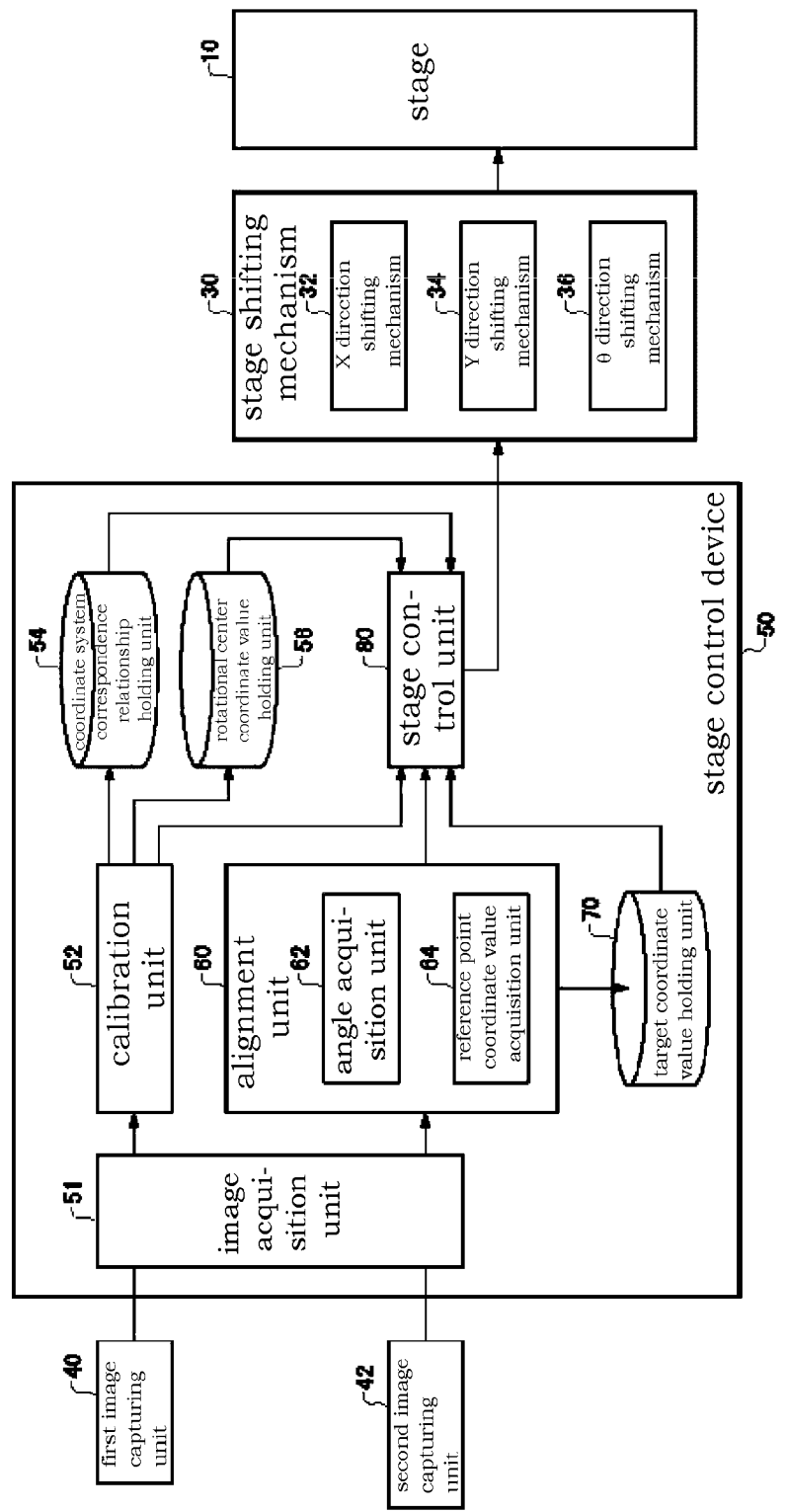
FIG. 3 is a figure showing functional blocks of this object control system according to an embodiment of the present invention.

FIG. 3 shows functional blocks of the object control system 100. The first image capturing unit 40 supplies the first image to a calibration unit 52 and to an alignment unit 60 via an image acquisition unit 51. In the same manner, the second image capturing unit 42 supplies the second image to the calibration unit 52 and to the alignment unit 60 via the image acquisition unit 51.

The stage shifting mechanism 30 comprises an X direction shifting mechanism 32 that shifts the stage 10 parallel to itself in the X direction, a Y direction shifting mechanism 34 that shifts the stage 10 parallel to itself in the Y direction, and a θ direction shifting mechanism 36 that functions as a rotation mechanism and that rotates the stage 10 around a rotation axis along the Z direction, as a center.

The stage control device 50 comprises the image acquisition unit 51, the calibration unit 52, a coordinate system correspondence relationship holding unit 54, a rotational center coordinate value holding unit 56, the alignment unit 60, a target coordinate value holding unit 70, and a stage control unit 80.

The image acquisition unit 51 acquires the first image captured by the first image capturing unit 40 and the second image captured by the second image capturing unit 42, and supplies this first image and this second image that have thus been acquired to the calibration unit 52 and to the alignment unit 60.

The calibration unit 52 performs calibration on the basis of the shifting trajectories of stage reference points included in the first image and in the second image, determined in advance upon the stage 10. In other words, the calibration unit 52 acquires positional relationships between the stage 10 and the first image capturing unit 40 and the second image capturing unit 42, i.e. coordinate system correspondence relationships that specify the relationships of correspondence between the orthogonal coordinate system of the stage 10 (sometimes termed the "stage coordinate system") and the first pixel coordinate system and the second pixel coordinate system, which are orthogonal coordinate systems for the ranges of image capture by the first image capturing unit 40 and the second image capturing unit 42. Furthermore, the calibration unit 52 acquires rotational center coordinate value correspondence relationships that specify the relationships of correspondence between X and Y coordinate values for the rotational center of the stage 10 in the stage coordinate system (sometimes termed "stage X and Y coordinate values") and X and Y coordinate values in the first pixel coordinate system (sometimes termed "first pixel X and Y coordinate values") and X and Y coordinate values in the second pixel coordinate system (sometimes termed "second pixel X and Y coordinate values"). It should be understood that the steps by which the coordinate system correspondence relationship and the rotational center coordinate value correspondence relationship are acquired will be described hereinafter.

The coordinate system correspondence relationship holding unit 54 holds the coordinate system correspondence relationships acquired by the calibration unit 52. Moreover, the rotational center coordinate value holding unit 56 holds the rotational center coordinate value correspondence relationships acquired by the calibration unit 52.

The alignment unit 60 comprises an angle acquisition unit 62 and a reference point coordinate value acquisition unit 64, and performs alignment on the basis of the first image and the second image, so as to shift the object 20 to its target position.

On the basis of the first reference mark in the first image, the angle acquisition unit 62 acquires a first angle, which is the angle between, for example, the Y axis in the first pixel coordinate system which serves as the first reference line determined in advance for the first image, and the first object line within the first image. In a similar manner, on the basis of the second reference mark in the second image, the angle acquisition unit 62 acquires a second angle, which is the angle between, for example, the Y axis in the second pixel coordinate system which serves as the second reference line determined in advance for the second image, and the second object line within the second image. In other words, if the first reference mark is taken as being the corner portion 20a of the object 20, then, on the basis of the first image, the angle acquisition unit 62 acquires the angle between the Y axis of the first pixel coordinate system and the side 22a as this first angle. In a similar manner, if the second reference mark is taken as being the corner portion 20c of the object 20, then, on the basis of the second image, the angle acquisition unit 62 acquires the angle between the Y axis of the second pixel coordinate system and the side 22d as this second angle.

The reference point coordinate value acquisition unit 64 acquires first pixel X and Y coordinate values of the first reference point specifying the first reference mark within the first image. In a similar manner, the reference point coordinate value acquisition unit 64 acquires second pixel X and Y coordinate values of the second reference point specifying the second reference mark within the second image. For example, if the first reference mark is taken as being the corner portion 20a of the object 20, then the reference point coordinate value acquisition unit 64 acquires the first pixel X and Y coordinate values of the vertex 20b of the corner portion 20a as being the first pixel X and Y coordinate values of the first reference point. In a similar manner, if the second reference mark is taken as being the corner portion 20c of the object 20, then the reference point coordinate value acquisition unit 64 acquires the second pixel X and Y coordinate values of the vertex 20d of the corner portion 20a as being the second pixel X and Y coordinate values of the second reference point.

When the object 20 has been established in the target position, on the basis of the first image and the second image captured by the first image capturing unit 40 and by the second image capturing unit 42, the target coordinate value holding unit 70 holds the first angle and the second angle acquired by the angle acquisition unit 62 as being the first target angle and the second target angle.

Furthermore, the target coordinate value holding unit 70 holds the first pixel X and Y coordinate values of the first reference point and the second pixel X and Y coordinate values of the second reference point, acquired by the reference point coordinate value acquisition unit 64, as being the first target pixel X and Y coordinate values and the second target pixel X and Y coordinate values.

And the stage control unit 80 specifies a target rotational amount for the stage, in order to move the first angle and the second angle acquired on the basis of the first image and the second image closer to the first target angle and the second target angle held in the target coordinate value holding unit 70. Moreover, the stage control unit 80 specifies shift amounts for the stage in the X direction and in the Y direction, in order to move the first pixel X and Y coordinate values of the first reference point and the second pixel X and Y coordinate values of the second reference point acquired on the basis of the first image and the second image closer to the first target pixel X and Y coordinate values and the second target pixel X and Y coordinate values held in the target coordinate value holding unit 70.

Figure 4:
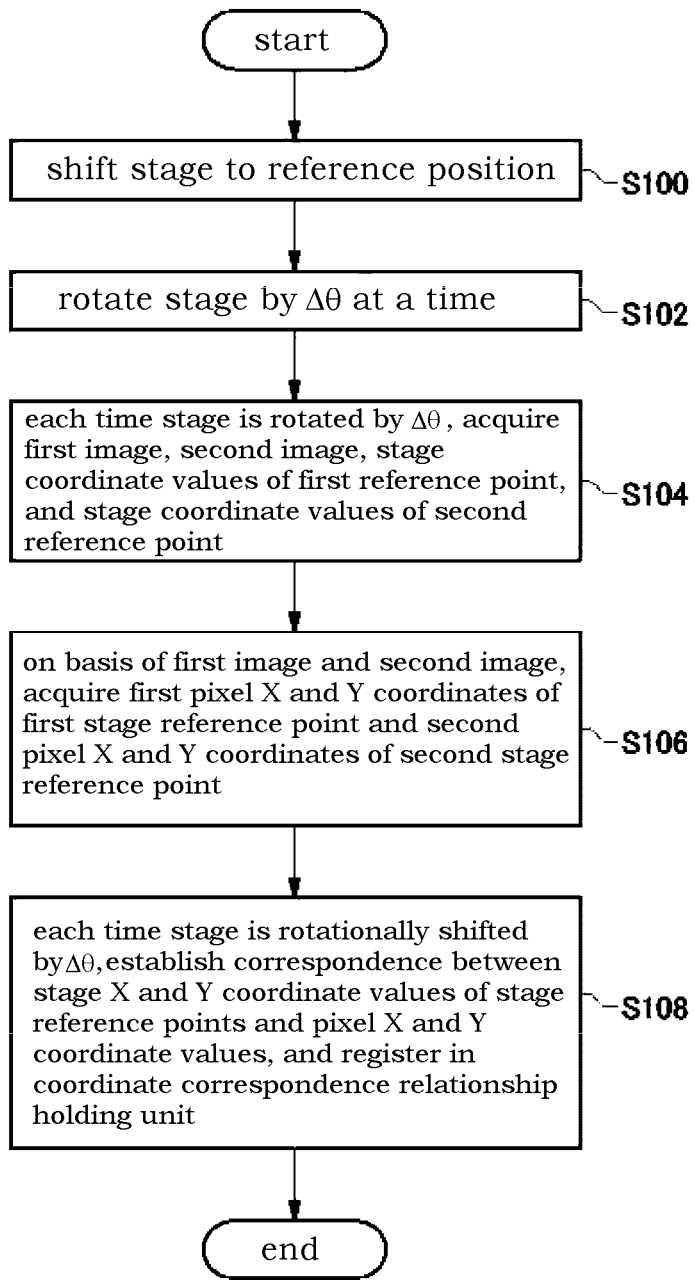
FIG. 4 is a flow chart showing an example of steps performed in calibration by a calibration unit while acquiring coordinate system correspondence relationships.

FIG. 4 is a flow chart showing an example of steps performed during the calibration by the calibration unit 52 while acquiring these coordinate system correspondence relationships. First, the calibration unit 52 issues a command to the stage control unit 80 to shift the stage 10 to a reference position, for which the stage X and Y coordinate values of the rotational center of the stage 10, and the stage X and Y coordinate values of the first stage reference point captured by the first image capturing unit 40 and of the second stage reference point captured by the second image capturing unit 42 have been acquired in advance (a step S100).

Next, the calibration unit 52 commands the stage control unit 80 to rotationally shift the stage 10 by Δθ at a time (a step S102). And, each time the stage 10 is thus rotationally shifted by Δθ, the calibration unit 52 acquires a first image and a second image from the first image capturing unit 40 and the second image capturing unit 42, and to acquire the stage coordinate values of the first reference point and the stage coordinate values of the second reference point (a step S104). Furthermore, each time the first image and the second image are acquired, the calibration unit 52 acquires the first pixel X and Y coordinate values of the first stage reference point in the first image and the second pixel X and Y coordinate values of the second stage reference point in the second image (a step S106). In the following, if it is not necessary to distinguish between the first pixel X and Y coordinate values and the second pixel X and Y coordinate values, they will be referred to generically as "pixel X and Y coordinate values."

Next, the calibration unit 52 establishes a correspondence between the stage X and Y coordinate values of the stage reference points that have been acquired each time the stage 10 is rotationally shifted by Δθ, and the pixel X and Y coordinate values, and registers this correspondence in the coordinate system correspondence relationship holding unit 54.

FIG. 5 shows an example of a coordinate correspondence relationship table specifying the correspondence relationships between the stage X and Y coordinate values held in the coordinate system correspondence relationship holding unit 54 and the pixel X and Y coordinate values.

Furthermore, the calibration unit 52 may, for example, acquire the rotational center coordinate value correspondence relationship by performing the following steps.

The calibration unit 52 acquires the plurality of first pixel X and Y coordinate values of the plurality of first stage reference points within the plurality of first images acquired each time rotational shifting by Δθ is performed, specifies a virtual circular arc by the method of least squares on the basis of this plurality of first pixel X and Y coordinate values, and acquires first pixel X and Y coordinate values for the rotational center of the first pixel coordinate system on the basis of the first pixel X and Y coordinate values that correspond to the center of this virtual circular arc. In a similar manner, the calibration unit 52 acquires the second pixel X and Y coordinate values of the rotational center of the second pixel coordinate system on the basis of the plurality of second images acquired each time rotational shifting by Δθ is performed. Moreover, the calibration unit 52 refers to the coordinate correspondence relationship table and acquires stage X and Y coordinate values that correspond to the first pixel X and Y coordinate values and to the second pixel X and Y coordinate values of the rotational centers. And the calibration unit 52 establishes a correspondence between the pixel X and Y coordinate values and the stage X and Y coordinate values that have been acquired, and registers this correspondence in the rotational center coordinate value holding unit 56.

Moreover, it would also be acceptable to arrange for the calibration unit 52 to acquire a rotational center coordinate value correspondence relationship by performing the following steps.

The calibration unit 52 acquires a first image that includes a first stage reference point, and acquires first pixel X and Y coordinate values of the first stage reference point in the first image before rotation as being first pixel X and Y coordinate values before rotation. Next, it commands the stage control unit 80 to rotate the stage 10 by Δθ, so as to rotate the stage 10 by a range for which the first stage reference point is included in the first image, in other words by a range for which the first stage reference point is included in the image capture range of the first image capturing unit 40. After the stage 10 has been rotated by Δθ, the calibration unit 52 again acquires a first image that includes the first stage reference point. Next, the calibration unit 52 acquires first pixel X and Y coordinate values of the first stage reference point in the first image after rotation as being first pixel X and Y coordinate values after rotation. After having acquired the first pixel X and Y coordinate values before rotation by Δθ and after rotation by Δθ, the calibration unit 52 derives an isosceles triangle shape in which the straight line formed by the first pixel X and Y coordinate values before rotation by Δθ and those values after rotation by Δθ is taken as being the bottom edge, and Δθ corresponding to the rotational amount for the stage 10 that was commanded to the stage control unit 80 is taken as being the apical angle. Then the calibration unit 52 acquires the first pixel X and Y coordinate values of the vertex at the apical angle Δθ of this isosceles triangle shape that has been derived, as being the first pixel X and Y coordinate values of the rotational center of the first pixel coordinate system. In a similar manner, the calibration unit 52 acquires second pixel X and Y coordinate values of the second stage reference point in the second image before rotation by Δθ and second pixel X and Y coordinate values of the second stage reference point in the second image after rotation by Δθ. Moreover, the calibration unit 52 derives an isosceles triangle shape in which the straight line that connects the second pixel X and Y coordinate values before rotation by Δθ and the second pixel X and Y coordinate values after rotation by Δθ is taken as being the bottom edge and Δθ is taken as being the apical angle, and acquires the second pixel X and Y coordinate values of the vertex at the apical angle Δθ of this isosceles triangle shape that has been derived as being the second pixel X and Y coordinate values of the rotational center of the second pixel coordinate system. Furthermore, the calibration unit 52 refers to the coordinate correspondence relationship table, and acquires the stage X and Y coordinate values corresponding to the first pixel X and Y coordinate values and the second pixel X and Y coordinate values of the rotational centers. Then the calibration unit 52 establishes a correspondence between these pixel X and Y coordinate values that it has acquired and the stage X and Y coordinate values, and registers this correspondence in the rotational center coordinate value holding unit 56.

By the above processing, the calibration unit 52 acquires the coordinate system correspondence relationships between the stage coordinate system and each of the pixel coordinate systems, and the rotational center coordinate value correspondence relationships between the stage X and Y coordinate values of the rotational centers and the respective pixel X and Y coordinate values. It should be understood that the procedure described above for acquisition of the coordinate system correspondence relationships and the rotational center coordinate system correspondence relationships is only an example; it would also be acceptable to employ some other per se known procedure.

Figure 6:
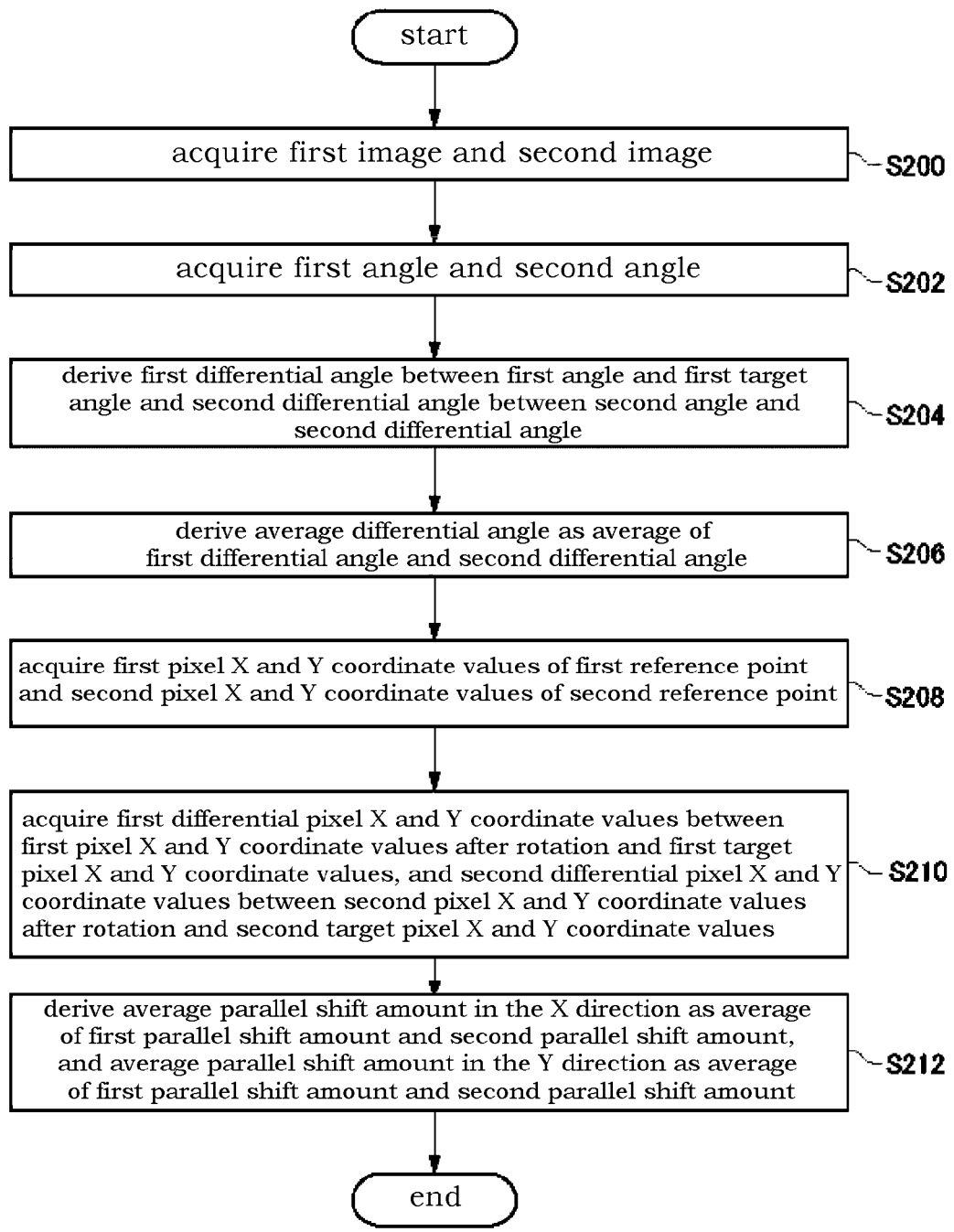
FIG. 6 is a flow chart showing an example of an alignment procedure.

FIG. 6 is a flow chart showing an example of the alignment procedure. First, in the state in which the object 20 has been installed upon the stage 10, the alignment unit 60 acquires a first image and a second image captured by the first image capturing unit 40 and the second image capturing unit 42 (a step S200). Then, on the basis of the first image and the second image, using the angle acquisition unit 62, the alignment unit 60 acquires a first angle between the Y axis of the first pixel coordinate system and the first object line in the first image, and a second angle between the Y axis of the second pixel coordinate system and the second object line in the second image (a step S202).

The alignment unit 60 then refers to the target coordinate value holding unit 70, and acquires the first target angle and the second target angle. Moreover, the alignment unit 60 derives a first differential angle that is given by the difference between the first angle acquired in the step S200 and the first target angle, and a second differential angle that is given by the difference between the second angle acquired in the step S200 and the second target angle (a step S204). And, by taking the average of the first differential angle and the second differential angle derived in the step S204, the alignment unit 60 derives an average differential angle to be taken as a target rotational amount (a step S206).

Furthermore, on the basis of the first image and the second image, the alignment unit 60 acquires with the reference point coordinate value acquisition unit 64 first pixel X and Y coordinate values of the first reference point in the first image and second pixel X and Y coordinate values of the second reference point in the second image (a step S208).

Then the alignment unit 60 specifies first pixel coordinate values when the first reference point having the pixel X and Y coordinate values acquired in the step S208 has been rotated by just the average differential angle around a center at the first pixel X and Y coordinate values corresponding to the rotational center position specified by the calibration. In a similar manner, the alignment unit 60 specifies second pixel coordinate values when the second reference point having the pixel X and Y coordinate values has been rotated by just the average differential angle around a center at the second pixel X and Y coordinate values corresponding to the rotational center position specified by the calibration. In addition, the alignment unit 60 refers to the target coordinate value holding unit 70 and acquires the first target pixel X and Y coordinate values and the second target X and Y coordinate values, and derives first differential pixel X and Y coordinate values as being the differences between the first pixel X and Y coordinate values after the rotation specified as described above has been performed and the first target X and Y coordinate values, and second differential pixel X and Y coordinate values as being the differences between the second pixel X and Y coordinate values after the rotation specified as described above has been performed and the second target X and Y coordinate values (a step S210).

Furthermore, the stage control unit 80 specifies first parallel shift amounts in the X direction and in the Y direction on the basis of the first differential X and Y pixel values acquired in the step S210, and specifies second parallel shift amounts in the X direction and in the Y direction on the basis of the second differential X and Y pixel values. Moreover, the stage control unit 80 derives an average parallel shift amount in the X direction and an average parallel shift amount in the Y direction by taking the average of the first parallel shift amount in the X direction and the second parallel shift amount in the X direction, and the average of the first parallel shift amount in the Y direction and the second parallel shift amount in the Y direction, respectively (a step S212).

The stage control unit 80 then controls the stage shifting mechanism 30 and shifts the stage 10 on the basis of the average differential angle, the average parallel shift amount in the X direction, and the average parallel shift amount in the Y direction, so as to shift the object 20 to the target position.

It should be understood that, in the above description, an example has been explained in which it is the alignment unit 60 that derives the average differential angle. However, it would also be acceptable to arrange for the alignment unit 60 to supply the first angle and the second angle acquired in the step S202 to the stage control unit 80, and for it to be the stage control unit 80 that obtains the average differential angle.

As described above, according to this embodiment, by using images that include reference marks including object lines that give the inclination of the object 20 and reference points within the images, for example sides and vertices at one corner portion of the object 20, the stage control device 50 acquires the inclination of the object 20 in the images, and, on the basis of this inclination and its position, shifts the stage 10 and thereby shifts the object 20 to its target position, so as to be moved closer to the target inclination and the target position of the object 20 in the images that have been acquired in advance.

In this embodiment, the stage control device 50 acquires the target differential angle and the target pixel coordinate values on the basis of the first image and the second image (sometimes generically termed "images") captured by the first image capturing unit 40 and the second image capturing unit 42 (which are sometimes generically termed "image capturing units") respectively. In other words, for each of the image capturing units, the stage control device 50 acquires target differential angles and target pixel coordinate values that specify the amount of shifting of the stage.

For example, if the distance between two marks is inputted in advance and an image of each mark is captured by one of two image capturing units, and the coordinates of the rotational center of the stage are acquired on this basis of this distance, then it is necessary to establish the positions of installation of the two image capturing units accurately. However, in this embodiment, each of the images of the image capturing units is utilized individually, and their individual target differential angles and target pixel coordinate values are acquired. Accordingly, it is acceptable to install the image capturing units without determining the distance between them and so on accurately. Moreover, the target rotational amount, the target shift amount in the X direction, and the target shift amount in the Y direction are acquired by averaging the respective target differential angles and the amounts of parallel shifting in the X direction and in the Y direction in terms of coordinate values, that are acquired by utilizing each of the images of the image capturing units independently. Accordingly, it is possible to acquire the target rotational amount, the target shift amount in the X direction, and the target shift amount in the Y direction accurately. Furthermore, it is possible to reduce the number of times by which rotation and/or parallel shifting needs to be performed until the deviations between the positions of the marks and the target positions of the marks are cancelled, and thus it is possible to shorten the time period that is required for the object 20 to be shifted to its target position.

As described above, in this embodiment, the stage control device 50 acquires a target differential angle and target pixel coordinate values that specify the shift amount of the stage, for each of the image capturing units. Accordingly, even if for example no reference mark is included in the image that is captured by one of the image capturing units, or even if a malfunction has occurred with one of the image capturing units, then it is still possible to shift the object 20 to its target position according to the target differential angle and target pixel coordinate values that are based upon the image captured by the other image capturing unit. In other words, even if for example no reference mark is included in the image that is captured by one of the image capturing units, or even if a malfunction has occurred with one of the image capturing units, then it is still possible to keep low the time period that is required until the object 20 is shifted to its target position.

It should be understood that, in this embodiment, the stage control device 50 acquires the first differential angle or the second differential angle from the difference between the first angle or the second angle, and the first target angle or the second target angle. However, it would also be acceptable to arrange for the stage control device 50 to acquire the first differential angle or the second differential angle directly from the angle that is subtended by the first object line or the second object line, and the first target object line or the second target object line.

Figure 7:
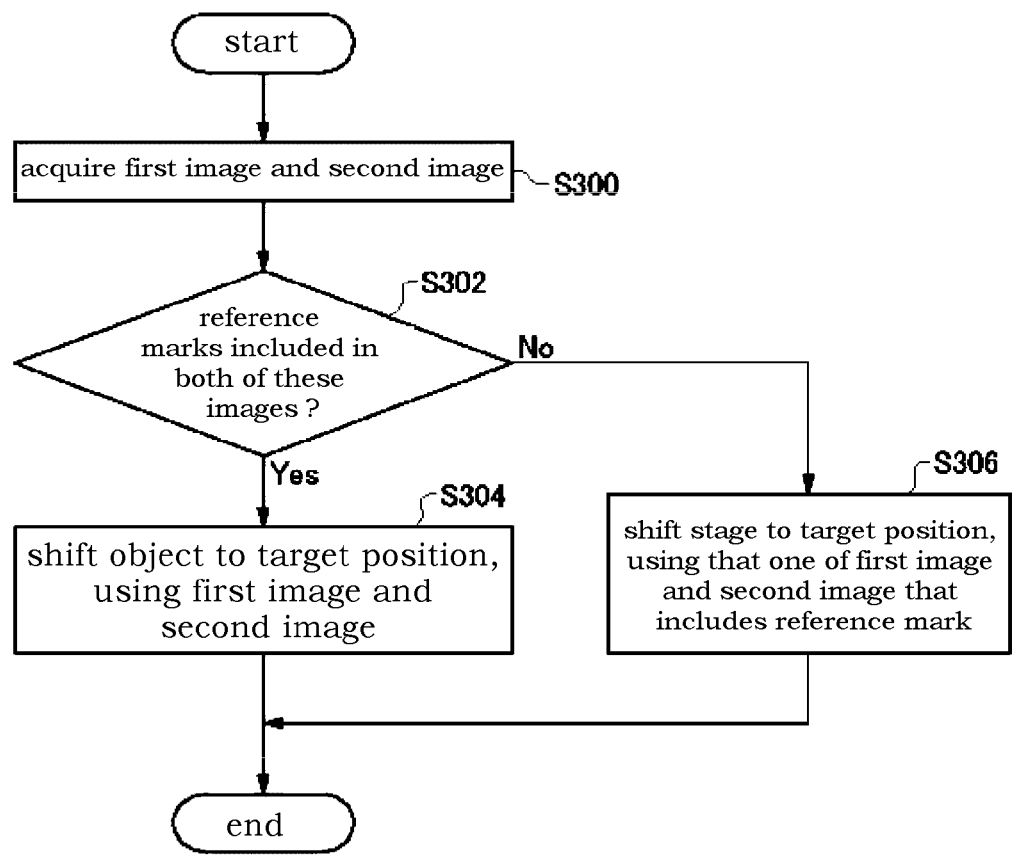
FIG. 7 is a flow chart showing a processing sequence performed by a stage control device, when it is not possible to use an images based upon one of two image capturing units, and when shifting the object to the target position by using an image based upon the other image capturing unit.

FIG. 7 is a flow chart showing the sequence of processing performed by the stage control device 50, when it is not possible to use an image based upon one of the image capturing units, and when shifting the object 20 to the target position using an image based upon the other image capturing unit.

In the state in which the object 20 is installed upon the stage 10, the stage control device 50 acquires images with the respective image capturing units (a step S300). Next, the stage control device 50 refers to each of these images, and makes a decision as to whether or not the respective reference marks are included within these images (a step S302). If the result of this decision is that the marks are thus included (i.e. if the result of the decision in the step S302 is affirmative "Y"), then, as per the above description, the average differential angles and the average parallel shift amounts in the X direction and in the Y direction are derived on the basis of the respective images, and the object 20 is shifted to the target position by shifting the stage on the basis of the averages of these differential angles and of these average parallel shift amounts in the X direction and in the Y direction (a step S304). On the other hand, if the result of this decision is that an image is present in which the reference mark is not thus included (i.e. if the result of the decision in the step S302 is negative "N"), then the stage control device 50 shifts the object 20 to the target position by acquiring the differential angle and the differential pixel X and Y coordinate values on the basis of the one image in which the reference mark is included, and by shifting the stage on the basis of this differential angle and these differential pixel X and Y coordinate values (a step S306).

According to the above, even if no reference mark is included in the image that is captured by one of the image capturing units, or even if a malfunction has occurred with one of the image capturing units, then it is still possible to shift the object 20 to its target position by using the target differential angle and the target pixel coordinate values that are based upon the image captured by the other image capturing unit.

Furthermore, as described above, it is possible, on the basis of the image captured by one of the image capturing units, to control the stage 10 with the stage control device 50 by ascertaining a position within the image that includes the inclination of the object 20. Accordingly, if for example no reference mark has been included in the image captured by one of the image capturing units, then it will be acceptable to control the stage 10 on the basis of the image captured by the other image capturing unit, and to arrange for the object 20 to be shifted so that the reference mark is included in the image captured by that one of the image capturing units.

Figure 8:
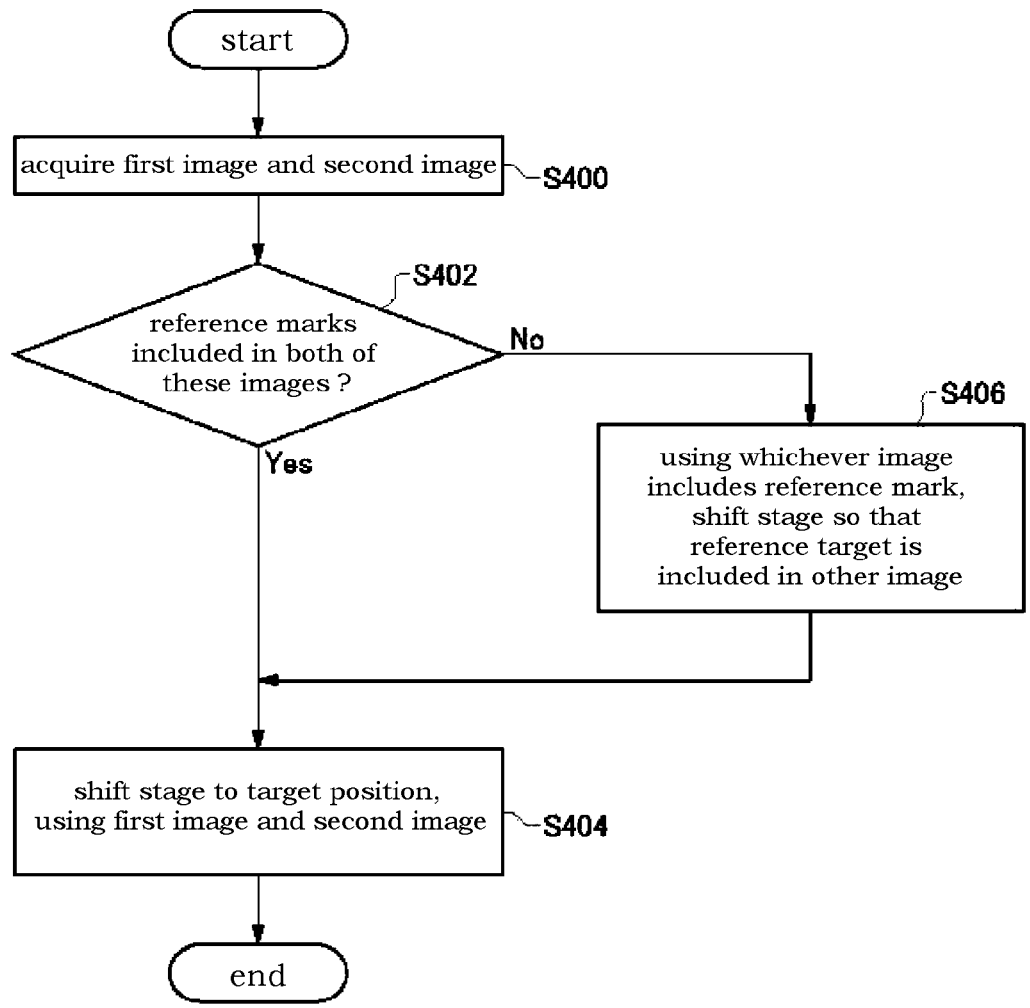
FIG. 8 is a flow chart showing a processing sequence performed by the stage control device, when no reference mark is included in one of the images captured by one of the image capturing units.

FIG. 8 is a flow chart showing the sequence of processing performed by the stage control device 50, when no reference mark is included in one of the images captured by one of the image capturing units.

First, in the state in which the object 20 is installed upon the stage 10, the stage control device 50 acquires the respective images that are captured by each of the image capturing units (a step S400). Next, the stage control device 50 refers to these two images, and makes a decision as to whether or not reference marks are included in both of the images (a step S402). If the result of this decision is that the marks are thus included (i.e. if the result of the decision in the step S402 is affirmative "Y"), then, as per the above description, the average differential angles and the average parallel shift amounts in the X direction and in the Y direction are derived on the basis of the respective images, and the object 20 is shifted to the target position by shifting the stage on the basis of the averages of these differential angles and of these average parallel shift amounts in the X direction and in the Y direction (a step S404). On the other hand, if the result of this decision is that an image is present in which the reference mark is not thus included (i.e. if the result of the decision in the step S402 is negative "N"), then, on the basis of that one of the images in which the reference mark is included, the stage control device 50 ascertains a position that includes the inclination of the object 20 within that one of the images, and shifts the object 20 so that the reference mark is included within the other one of the images (a step S406). And, when the system has reached the state in which the reference mark is included in the other image, then the stage control device 50 shifts the object 20 to the target position by shifting the stage on the basis of the average differential angle and the average parallel shift amounts in the X direction and in the Y direction (the step S406).

As described above, with the stage control device 50 according to this embodiment, on the basis of the image captured by one of the image capturing units, it is possible to ascertain a position in that image that includes the inclination of the object 20, and thereby to control the stage 10. Accordingly, if for example no reference mark is included in the image that is captured by one of the image capturing units, then it is possible to control the stage 10 on the basis of the image that is captured by the other one of the image capturing units, and thus it is possible to shift the object 20 so that the reference mark is included within the image captured by that one of the image capturing units.

Furthermore, in the above description, the stage control device 50 derived the target shift amount for the stage by taking the average of the first differential angle and the second differential angle, and by taking the averages of the parallel shift amounts in the X direction and in the Y direction, specified on the basis of the first differential pixel X and Y coordinate values and the second differential pixel X and Y coordinate values. However, it would also be acceptable to arrange for the stage control device 50 to derive the target shift amount for the stage by assigning weightings to each of the first differential angle and the second differential angle, and to the first parallel shift amounts in the X direction and in the Y direction and to the second parallel shift amounts in the X direction and in the Y direction, and by taking weighted averages thereof.

If the target shift amount is to be derived on the basis of such weighted averages, then the stage control device 50 should include a weighting storage unit that stores the values of weightings that are determined for each of the image capturing units. If the resolving powers of the first image capturing unit 40 and of the second image capturing unit 42 are different, for example, then this weighting storage unit may store weightings for the first image capturing unit 40 and for the second image capturing unit 42, such that the one thereof that has the higher resolving power has a larger weighting than the one that has the lower resolving power. And the alignment unit 60 acquires the respective weightings corresponding to each of the captured images from the weighting storage unit, performs weighted averaging upon the first differential angle and the second differential angle, and upon the first parallel shift amounts in the X direction and Y direction and the second parallel shift amounts in the X direction and Y direction, while giving them their respective weightings, and acquires a target rotational amount for the stage and shift amounts for the stage in the X direction and in the Y direction on the basis of the differential angle and the parallel shift amounts in the X direction and in the Y direction that have thus been obtained by weighted averaging.

It should be understood that, as cases in which the resolving powers of the two image capturing units are different, there may be cited, for example, a case in which the resolutions of the two image capturing units are different, or a case in which the image capture ranges over which the two image capturing units capture images are different.

Furthermore, in the above description, the stage control device 50 acquired a target shift amount for the stage on the basis of images acquired by two image capturing units. However, it would also be acceptable to arrange for the stage control device 50 to acquire the target shift amount for the stage on the basis of images acquired by three or more image capturing units. In this case, for example, it would be possible to arrange for the stage control device 50 to acquire the shift amounts for the stage in the X direction and in the Y direction by acquiring the barycenters of the parallel shift amounts in the X direction and in the Y direction, as specified from the differential pixel X and Y coordinate values acquired on the basis of each of the images.

Furthermore, the stage coordinate values respectively corresponding to the pixel X and Y coordinate values of the rotational centers in the images captured by the image capturing units are not limited to being in agreement with one another. Accordingly, after having corrected the pixel X and Y coordinate values of the reference points so that the stage coordinate values that respectively correspond to the pixel X and Y coordinate values of the rotational centers of the images agree with one another, it would also be acceptable to arrange to derive the differential pixel X and Y coordinate values on the basis of the X and Y pixel values after amendment.

Now, it is often the case that the position of the rotational center of the stage 10 during calibration is the position of the rotational center that is initially set, or is the position of the rotational center corresponding to the position at which the task of actually shifting the object 20 is performed, or the like. Accordingly, the position of the rotational center during calibration is not limited to being included within the ranges of image capture by the image capturing unit(s). In other words, it often is the case that the calibration unit 52 performs calibration by rotating the stage 10 around a rotational center that is positioned outside the image capture range of one of the image capturing unit(s).

Figure 9A:
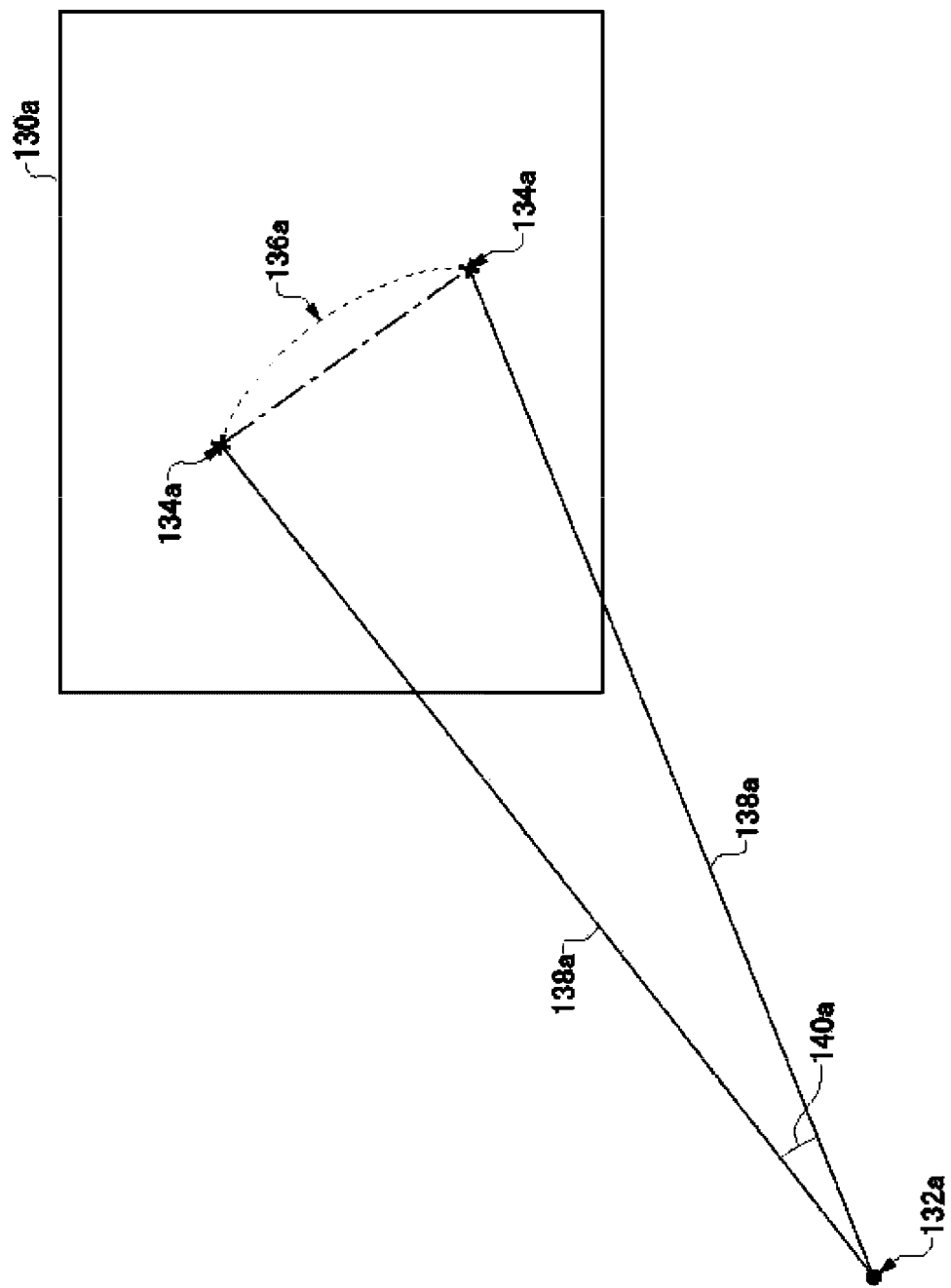
FIG. 9A is a figure showing an example of the shifting trajectory of a mark, when the stage is rotated about a rotational center that is positioned outside one of the ranges of image capture.

FIG. 9A is a figure showing an example of the shifting trajectory of a mark, when the stage 10 is rotated about a rotational center that is positioned outside one of the ranges of image capture.

When the stage 10 is rotated about a rotational center 132a that is positioned outside an image capture range 130a, then the trajectory of a mark 134a included in the image capture range 130a describes one portion 136a of a circular arc. Accordingly, sometimes it is the case that the errors included in the pixel X and Y coordinate values of the rotational center position acquired from this circular arc are comparatively large. In a similar manner, when the stage 10 is rotated about the rotational center 132a that is positioned outside the image capture range 130a, it is often the case that the length of each of the two equal sides 138a of the isosceles triangle shape that is acquired on the basis of the mark 134a included in the image before rotation and the mark 134a included in the image after rotation is comparatively long, while the angle 140a of its apical angle is comparatively small. Accordingly, sometimes it happens that the errors included in the pixel X and Y coordinate values of the position of the rotational center that are acquired from this isosceles triangle shape are comparatively large.

Figure 9B:
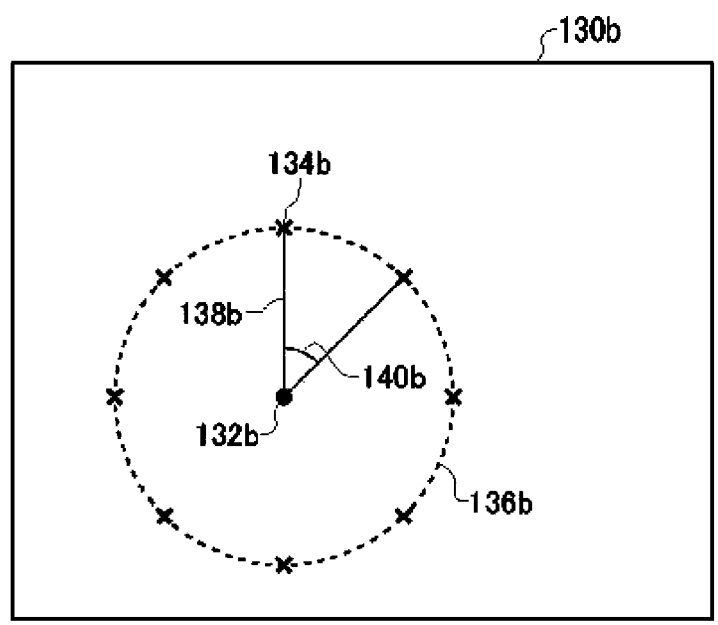
FIG. 9B is a figure showing an example of the shifting trajectory of a mark, when the stage is rotated about a rotational center that is positioned within one of the ranges of image capture.

FIG. 9B is a figure showing an example of the shifting trajectory of a mark, when the stage 10 is rotated about a rotational center that is positioned within one of the ranges of image capture.

The radius 138b of the circular arc 136b that is drawn by the trajectory of a mark 134b included within the image capture range 130b is smaller than the radius 138a of the circular arc 136a that was based upon the rotational center position 132a outside the image capture range 130a. Accordingly, the probability is high that the errors included in the pixel X and Y coordinate values of the position 132b of the rotational center acquired from this circular arc 136b are comparatively small. In a similar manner, when the stage 10 is rotated about the rotational center 132b that is positioned within the image capture range 130b, the length of each of the two equal sides of the isosceles triangle shape that is acquired is comparatively short, while the angle 140b of its apical angle is comparatively large. Accordingly the probability is high that the errors included in the pixel X and Y coordinate values of the position of the rotational center that are acquired from this isosceles triangle shape are comparatively small.

In other words, the probability is high that the errors included in the pixel X and Y coordinate values of the rotational center position that are acquired by rotating the stage 10 around a rotational center that is positioned close to the image capture range are smaller than the errors included in the pixel X and Y coordinate values of the position of the rotational center that are acquired by rotating the stage 10 around a rotational center that is positioned far from the image capture range.

Therefore, it would also be acceptable to arrange for the calibration unit 52 to acquire the pixel X and Y coordinate values of the position of the rotational center according to the procedure described below.

Figure 10:
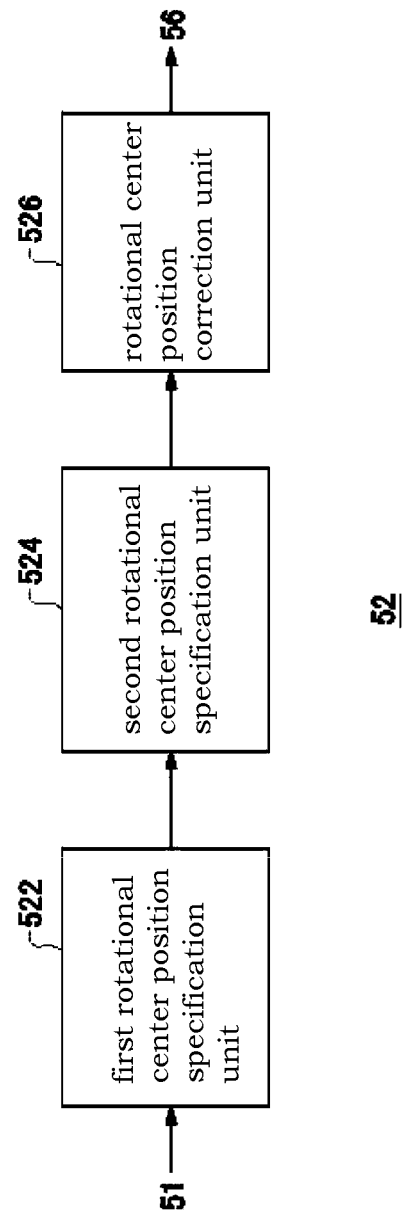
FIG. 10 is a figure showing an example of functional blocks of the calibration unit.

FIG. 10 shows an example of blocks that function when the calibration unit 52 acquires the pixel X and Y coordinate values of a rotational center.

Via the image acquisition unit 51, a first rotational center position specification unit 522 acquires images before the θ direction shifting mechanism 36 rotates the stage 10 around the position of a first rotational center that is a rotational center position outside the image capture range of the image capturing unit, and after the mechanism 36 has thus rotated the stage 10. A first mark that is affixed to the stage 10 in advance is included in each of these acquired images. And, on the basis of the pixel X and Y coordinate values of each of these first marks that are included in the corresponding images, the first rotational center position specification unit 522 specifies the pixel X and Y coordinate values of the θ direction shifting mechanism 36 as being the position of the first rotational center.

And via the image acquisition unit 51, on the basis of this position of the first rotational center, a second rotational center position specification unit 524 acquires images before the θ direction shifting mechanism 36 rotates the stage 10 around the rotational center position that is set within the image capture range that has been determined, and after the mechanism 36 has thus rotated the stage 10. A second mark that is affixed to the stage 10 in advance is included in each of these acquired images. And, on the basis of the pixel X and Y coordinate values of each of these second marks that are included in the corresponding images, the second rotational center position specification unit 524 specifies the pixel X and Y coordinate values of the θ direction shifting mechanism 36 as being the position of the second rotational center.

And a rotational center position correction unit 526 corrects the position of the first rotational center on the basis of the difference between the pixel X and Y coordinate values of the position of the set rotational center and the pixel X and Y coordinate values of the position of the second rotational center.

Figure 11:
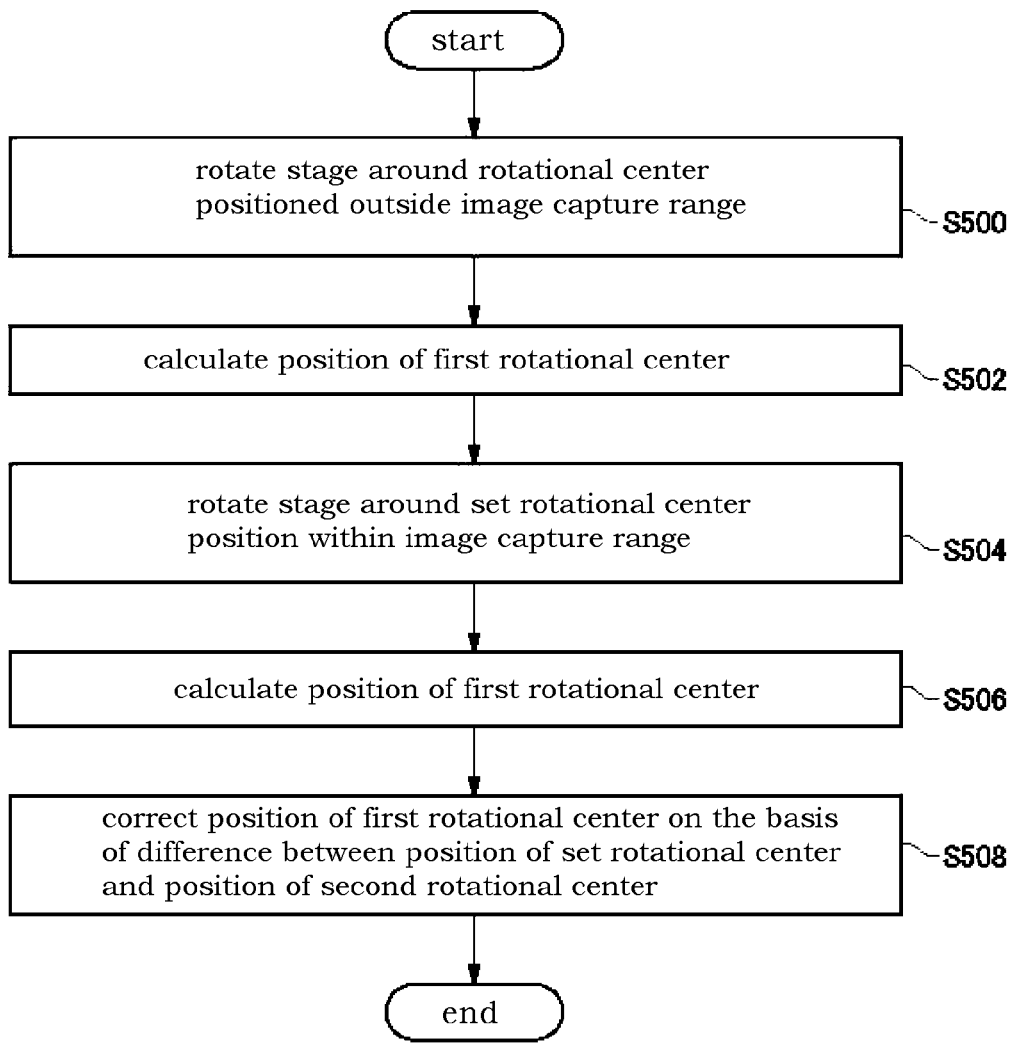
FIG. 11 is a flow chart showing an example of a procedure by which the calibration unit acquires coordinate values of the rotational center in the pixel coordinate system.

FIG. 11 is a flow chart showing an example of a procedure by which the calibration unit 52 acquires pixel X and Y coordinate values for the rotational center position.

First, the first rotational center position specification unit 522 commands the stage control unit 80 to rotate the stage 10 by a rotational amount that is set in advance, around a rotational center that is positioned outside the image capture range (a step S500).

Via the image acquisition unit 51, the first rotational center position specification unit 522 acquires an image before the stage 10 is rotated around this rotational center that is positioned outside the image capture range, and an image after the stage 10 is thus rotated. And, on the basis of the pixel X and Y coordinate values of the first marks included in both of the images that have thus been acquired, the first rotational center position specification unit 522 calculates the pixel X and Y coordinate values at the rotational center as being the position of the first rotational center (a step S502).

For example, the first rotational center position specification unit 522 may acquire pixel X and Y coordinate values that specify the position of the first rotational center on the basis of an isosceles triangle shape whose bottom edge is a straight line that connects the pixel X and Y coordinate values of the first mark that are respectively included in the two images acquired before rotation and after rotation, and whose apical angle is an angle corresponding to the amount of rotation of the stage that the stage control unit 80 was commanded to provide. It should be understood that it would also be acceptable to arrange for the calibration unit 52 to acquire pixel X and Y coordinate values that specify the position of the first rotational center on the basis of the trajectory of shifting of the first mark. In other words, the calibration unit 52 rotates the stage 10 by Δθ at a time. And the calibration unit 52 acquires the pixel X and Y coordinate values of the first marks, included in the images that are acquired each time such a rotation by Δθ is performed. Moreover, on the basis of the pixel X and Y coordinate values that are acquired, the calibration unit 52 specifies a virtual circular arc by the method of least squares. It would also be acceptable to arrange for the calibration unit 52 to acquire pixel X and Y coordinate values specifying the position of the first rotational center on the basis of pixel X and Y coordinate values corresponding to the center of the virtual circular arc that has been specified.

Next, the second rotational center position specification unit 524 commands the stage control unit 80 to rotate the stage 10 by just a rotational amount that has been set in advance, around a set rotational center position within the image capture range that has been determined on the basis of the position of the first rotational center (a step S504). For example, the second rotational center position specification unit 524 may select any pixel coordinate values that are included in the image capture range of the image capturing unit as being the position of the set rotational center. And next, the second rotational center position specification unit 524 acquires pixel X and Y coordinate values which are the differences between the pixel X and Y coordinate values of the position of the set rotational center that has been selected and the pixel X and Y coordinate values of the position of the first rotational center, and commands the stage control unit 80 to shift the stage 10 parallel to itself by just these differential pixel X and Y coordinate values. After the stage 10 has thus been shifted parallel to itself, via the stage control unit 80, the second rotational center position specification unit 524 commands the θ direction shifting mechanism 36 to rotate the stage 10 around the position of the set rotational center.

Via the image acquisition unit 51, the second rotational center position specification unit 524 acquires images before rotation around the position of the set rotational center, and after that rotation. Here, a second mark that is affixed to the stage 10 in advance is included in the acquired images. This second mark may, for example, be a mark affixed upon the stage 10 in advance and corresponding to the physical position of the rotational center of the θ direction shifting mechanism 36. In other words, this second mark could be a mark affixed to the rotational center of the stage 10. Then, on the basis of the pixel X and Y coordinate values of the second marks included in both of the images that have thus been acquired, the second rotational center position specification unit 524 calculates the pixel X and Y coordinate values at the rotational center as being the position of the second rotational center (a step S506). In other words, in a similar manner to that described above, for a second time, the second rotational center position specification unit 524 acquires pixel X and Y coordinate values that specify the position of the rotational center on the basis of an isosceles triangle shape whose bottom edge is a straight line that connects the pixel X and Y coordinate values of the second marks that are respectively included in the two images acquired before rotation and after rotation, and whose apical angle is an angle corresponding to the amount of rotation of the stage 10 that the stage control unit 80 was commanded to provide. Or, it would also be acceptable to arrange for the calibration unit 52, while rotating the stage 10 by Δθ at a time, to acquire the pixel X and Y coordinate values of the second marks included in each of the plurality of images acquired for each Δθ of rotation, to specify a virtual circular arc by the method of least squares on the basis of these pixel X and Y coordinate values, and to acquire pixel X and Y coordinate values that specify the position of the second rotational center from the pixel X and Y coordinate values that correspond to the center of this virtual circular arc.

Next, the rotational center position correction unit 526 calculates the difference between the pixel X and Y coordinate values of the position of the set rotational center and the pixel X and Y coordinate values of the position of the second rotational center. If there is no error in the pixel X and Y coordinate values of the position of the first rotational center, then there will be no difference between the pixel X and Y coordinate values of the position of the set rotational center that is obtained on the basis of the position of the first rotational center, and the pixel X and Y coordinate values of the position of the second rotational center. However, as described above, the probability is high that actually some error will be included in the position of the first rotational center that has been acquired by rotation around a rotational center position outside the image capture range. On the other hand, the error that is included in the position of the second rotational center that has been acquired by rotation around a rotational center position within the image capture range will be smaller than the error that is included in the position of the first rotational center. Thus, the rotational center position correction unit 526 calculates differential pixel X and Y coordinate values as being the differences between the pixel X and Y coordinate values of the position of the set rotational center and the pixel X and Y coordinate values of the position of the second rotational center, and corrects the pixel X and Y coordinate values of the position of the first rotational center on the basis of these differential pixel X and Y coordinate values (a step S508). In more concrete terms, the pixel X and Y coordinate values of the position of the first rotational center are corrected by adding the differential pixel X and Y coordinate values to the pixel X and Y coordinate values of the position of the first rotational center.

According to the above, on the basis of the pixel X and Y coordinate values of the position of the rotational center that have been acquired by rotating the stage 10 around a rotational center positioned within the image capture range, the calibration unit 52 is able to enhance the accuracy of the X and Y pixel values of the position of the rotational center that is outside the image capture range by correcting the X and Y pixel values of the position of the rotational center that have been acquired by rotating the stage 10 around this rotational center that is positioned outside the image capture range.

It should be understood that the calibration unit 52 refers to the coordinate correspondence relationship table, acquires stage X and Y coordinate values that correspond to the pixel X and Y coordinate values of the rotational center position outside the image capture range after amendment, establishes a correspondence between the pixel X and Y coordinate values after amendment and the stage X and Y coordinate values, and registers this correspondence in the rotational center coordinate value holding unit 56.

Furthermore, in the above description, an example was explained in which, as the position of the set rotational center, a position was set within the image capture range on the basis of the position of the first rotational center. However sometimes, due to physical constraints upon the stage 10, it may be the case that it is not possible to set the rotational center position within the image capture range. In this case, a position for the rotational center that is closer to the image capture range than the position of the first rotational center may be set as the position of the set rotational center.

Yet further, in the above description, by way of example, as the object control system 100, a so called X-Y-θ stage was explained in which there was a proportional relationship between the rotational amount of a motor that functioned as a rotation mechanism, and the rotational amount of the stage. However, as the object control system 100, it would also be acceptable to employ a so called U-V-W stage that implements X-Y-θ shifting with a plurality of motors that shift the stage 10 in the X and Y directions, without the rotational amounts of these motors being directly correlated with the rotational amount of the stage. It should be understood that, if such an U-V-W stage is employed, then in the step S504 the calibration unit 52 may rotate the stage 10 by the following procedure. That is, as the position of the set rotational center, the calibration unit 52 selects any desired pixel coordinate values included within the image capture range of the image capturing unit on the basis of the position of the first rotational center. Then, the calibration unit 52 acquires the differential pixel X and Y coordinate values as the differences between the pixel X and Y coordinate values of this position of the set rotational center that has been selected and the pixel X and Y coordinate values of the position of the first rotational center. Moreover, the calibration unit 52 then commands the stage control unit 80 to rotate the stage while taking, as the position of the rotational center, a position shifted by just these acquired differential pixel X and Y coordinate values from the pixel X and Y coordinate values of the position of the first rotational center.

In addition, in the above description, an example was explained in which the calibration unit 52 corrected the pixel X and Y coordinate values of the position of the first rotational center on the basis of the differences between the pixel X and Y coordinate values of the position of the set rotational center and the pixel X and Y coordinate values of the position of the second rotational center. However, it would also be acceptable to arrange for the alignment unit 60 to correct the first differential pixel X and Y coordinate values and the second differential pixel X and Y coordinate values on the basis of the differences between the pixel X and Y coordinate values of the position of the set rotational center, as calculated by the calibration unit 52, and the pixel X and Y coordinate values of the position of the second rotational center. In other words, it may be arranged for the alignment unit 60 to add these differences to the first differential pixel X and Y coordinate values and to the second differential pixel X and Y coordinate values, respectively. Moreover, if two or more image capturing units are employed, then it would also be acceptable to arrange to correct the pixel X and Y coordinate values of each of the positions of the first rotational center by adding the corresponding differential pixel X and Y coordinate values to the pixel X and Y coordinate values of the position of the corresponding first rotational center specified on the basis of each of the images captured by each of the image capturing units.

Figure 12:
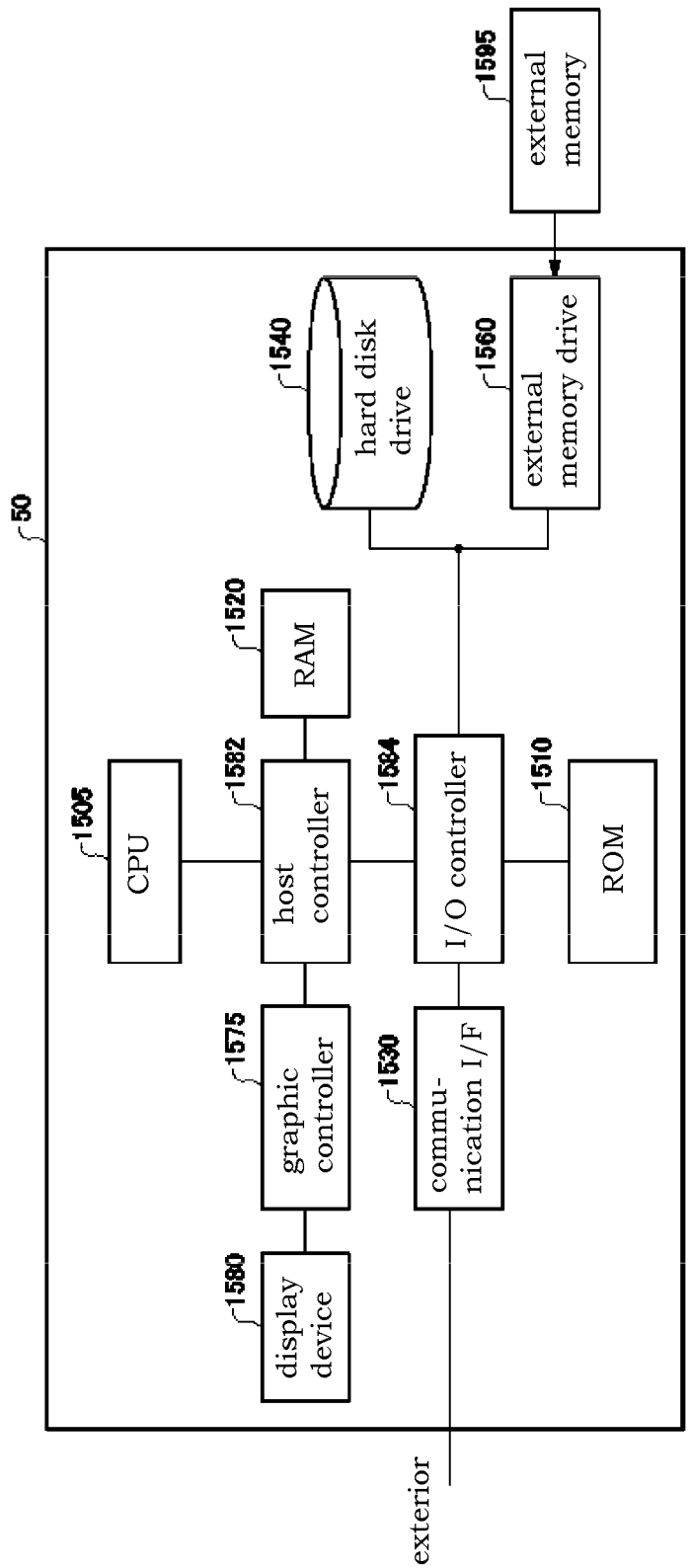
FIG. 12 is a figure showing the hardware structure of a stage control device.

FIG. 12 shows an example of the hardware structure of the stage control device 50. This stage control device 50 comprises a CPU 1505, a RAM 520, a graphic controller 1575, and a display device 1580, all of these being mutually connected together by a host controller 1582. Furthermore, the stage control device 50 comprises a communication I/F 1530 that is connected to the host controller 1582 by a I/O (input and output) controller 1584, a ROM 1510, a hard disk drive 1540, and an external memory drive 1560.

The CPU 1505 operates on the basis of a program that is stored in the ROM 1510, in the RAM 1520, or in the hard disk drive 1540, so as to control each section of the system. And the graphic controller 1575 displays image data acquired from the RAM 1520 and so on upon the display device 1580.

And the I/O (input and output) controller 1584 further connects input and output devices such as a mouse, a keyboard, and so on. The communication I/F 1530 supplies programs and/or data received via a network from externally to the ROM 1510, the RAM 1520, and/or the hard disk drive 1540. And the ROM 1510 holds a boot program that is executed by the CPU 1505 when the stage control device 50 starts up, and programs dependent upon the hardware of the stage control device 50 and so on.

The hard disk drive 1540 stores programs and data used by the CPU 1505. And the external memory drive 1560 supplies programs and/or data read from an external memory 1595 to the ROM 1510, the RAM 1520, and/or the hard disk drive 1540.

By the CPU 1505 executing a program stored in the ROM 1510, in the RAM 1520, and/or in the hard disk drive 1540, the stage control device 50 is caused to perform the functions of the calibration unit 52, the coordinate system correspondence relationship holding unit 54, the rotational center coordinate value holding unit 56, the alignment unit 60, the angle acquisition unit 62, the reference point coordinate value acquisition unit 64, the target coordinate value holding unit 70, and the stage control unit 80. It would also be acceptable for the program executed by the CPU 1505 not to be stored upon a recording medium such as the external memory 1595 or the like and supplied therefrom, but to be supplied from an external information processing device via a network.

While the present invention has been explained in the above by using an embodiment thereof, the technical scope of the present invention is not limited to the range that has been described with reference to the above embodiment. It will be clear that, to a person skilled in the art, it would be possible to make many different changes and/or improvements to the embodiment described above. It will be clear from the description of the scope of the Claims that versions which have been modified and/or improved in this way can also be included within the technical range of the present invention.

The sequence of execution of the various processes such as the operations, the procedures, the steps, and the stages of the device, system, program, and method disclosed in the scope of Claims, the specification, and the drawings is not particularly specified in terms of "before", "previously" and so on, and indeed, provided that the output of an earlier process is not used by a subsequent process, they are to be considered as being capable of being implemented in any order. With regard to the operating flow in the scope of Claims, in the specification, and in the drawings, even though for convenience the above explanation has employed the terms "first", "next" and so on, this should not be considered as implying that it is essential for the various processes to be implemented in this order.

EXPLANATION OF THE REFERENCE SYMBOLS

10: stage
20: object
30: stage shifting mechanism
32: X direction shifting mechanism
34: Y direction shifting mechanism
36: θ direction shifting mechanism
40: first image capturing unit
42: second image capturing unit
50: stage control device
51: image acquisition unit
52: calibration unit
522: first rotational center position specification unit
524: second rotational center position specification unit
526: rotational center position correction unit
54: coordinate system correspondence relationship holding unit
56: rotational center coordinate value holding unit
60: alignment unit
62: angle acquisition unit
64: reference point coordinate value acquisition unit
70: target coordinate value holding unit
80: stage control unit
100: object control system

FIGURE LEGENDS

FIG. 1
30: stage shifting mechanism
50: stage control device
FIG. 2: A, B
pixel coordinate system
FIG. 3
40: first image capturing unit
42: second image capturing unit
51: image acquisition unit
52: calibration unit
60: alignment unit
62: angle acquisition unit
64: reference point coordinate value acquisition unit
70: target coordinate value holding unit
54: coordinate system correspondence relationship holding unit
56: rotational center coordinate value holding unit
80: stage control unit
50: stage control device
30: stage shifting mechanism
32: X direction shifting mechanism
34: Y direction shifting mechanism
36: θ direction shifting mechanism
10: stage FIG. 4
start
S100: shift stage to reference position
S102: rotate stage by Δθ at a time
S104: each time stage is rotated by Δθ, acquire first image, second image, stage coordinate values of first reference point, and stage coordinate values of second reference point
S106: on basis of first image and second image, acquire first pixel X and Y coordinates of first stage reference point and second pixel X and Y coordinates of second stage reference point
S108: each time stage is rotationally shifted by Δθ, establish correspondence between stage X and Y coordinate values of stage reference points and pixel X and Y coordinate values, and register in coordinate correspondence relationship holding unit end
FIG. 5
stage coordinate system
pixel coordinate system
FIG. 6
start
S200: acquire first image and second image
S202: acquire first angle and second angle
S204: derive first differential angle between first angle and first target angle and second differential angle between second angle and second differential angle
S206: acquire first pixel X and Y coordinate values of first reference point and second pixel X and Y coordinate values of second reference point
S208: acquire first differential pixel X and Y coordinate values between first pixel X and Y coordinate values after rotation and first target pixel X and Y coordinate values, and second differential pixel X and Y coordinate values between second pixel X and Y coordinate values after rotation and second target pixel X and Y coordinate values
S210: derive average differential angle as average of first differential angle and second differential angle
S212: derive average parallel shift amount in the X direction as average of first parallel shift amount and second parallel shift amount, and average parallel shift amount in the Y direction as average of first parallel shift amount and second parallel shift amount end
FIG. 7
start
S300: acquire first image and second image
S302: reference marks included in both of these images?
S304: shift object to target position, using first image and second image
S306: shift stage to target position, using that one of first image and second image that includes reference mark end
FIG. 8
start
S400: acquire first image and second image
S402: reference marks included in both of these images?
S404: shift stage to target position, using first image and second image
S406: using whichever image includes reference mark, shift stage so that reference target is included in other image end
FIG. 10
522: first rotational center position specification unit
524: second rotational center position specification unit
526: rotational center position correction unit
FIG. 11
start
S500: rotate stage around rotational center positioned outside image capture range S502: calculate position of first rotational center
S504: rotate stage around position of set rotational center within image capture range
S506: calculate position of second rotational center
S508: correct position of first rotational center on the basis of difference between position of set rotational center and position of second rotational center end
FIG. 12
exterior
1580: display device
1575: graphic controller
1582: host controller
1530: communication I/F
1584: I/O controller
1540: hard disk drive
1560: external memory drive
1595: external memory

What is claimed:

1. An object control system, comprising:
   an image acquisition device that acquires a first image from a first image capturing device that captures said first image including a first reference mark that specifies a first object line determined in advance with respect to an object;
   an angle acquisition processing component that, on the basis of said first reference mark within said first image, acquires a first differential angle that specifies the angle between a first target object line, determined in advance with respect to said first image, and said first object line;
   an object control processing component that controls a rotation mechanism that rotates said object, on the basis of said first differential angle;
   a calibration processing component that specifies a rotational center position of a rotation mechanism that rotates a holding member upon which said object is held, and wherein:
   said image acquisition device acquires, with said first image capturing device, images including at least a portion of said holding member;
   said calibration processing component comprises:
      a first rotational center position specification processing component that specifies a first rotational center position of said rotation mechanism on the basis of positions of a first mark that is determined with respect to said holding member, included in said images before said holding member is rotated by said rotation mechanism and after that rotation;
      a second rotational center position specification processing component that determines, on the basis of said first rotational center position, a set rotational center position that is closer to the image capturing range of said first image capturing device than said first rotational center position, and that specifies a second rotational center position of said rotation mechanism on the basis of positions of a second mark that is determined with respect to said holding member, included in said images before said holding member is rotated by said rotation mechanism around said position of the set rotational center and after that rotation; and
      a rotational center position correction processing component that corrects said first rotational center position on the basis of said set rotational center position and said second rotational center position;
   and said object control processing component controls said rotation mechanism on the basis of said corrected position of the first rotational center.

2. The object control system according to claim 1, further comprising a calibration processing component that specifies a rotational center position of a rotation mechanism that rotates a holding member upon which said object is held, and wherein:
   said image acquisition device acquires, with said first image capturing device, first mark images including a first mark that is set in advance with respect to said holding member;
   said calibration unit acquires an isosceles triangle shape whose bottom edge is a straight line that connects the first marks that are respectively included in two said first mark images acquired by said image acquisition device before said holding member is rotated by said rotation mechanism and after that rotation, and whose apical angle is an angle corresponding to the amount of rotation of said rotation mechanism, and acquires said rotational center position on the basis of the position within the first mark image of the vertex of said apical angle of said isosceles triangle shape; and
   said object control processing component controls said rotation mechanism on the basis of said rotational center position.

3. The object control system according to claim 1, wherein:
   said first rotational center position specification processing component specifies said first rotational center position of said rotation mechanism on the basis of positions of said first mark included in said images before said holding member is rotated by said rotation mechanism around a rotational center position outside the image capture range of said first image capturing device, and after that rotation; and
   said second rotational center position specification processing component specifies said second rotational center position of said rotation mechanism on the basis of positions of said second mark included in said images before said holding member is rotated by said rotation mechanism around said position of the set rotational center that is included within the image capture range of said image capturing unit, and after that rotation.

4. The object control system according to claim 1, wherein:
   said image acquisition device acquires a second image from a second image capturing device that captures said second image including a second reference mark that specifies a second object line determined in advance with respect to said object;
   said angle acquisition processing component further, on the basis of said second reference mark within said second image, acquires a second differential angle that specifies the angle between a second target object line, determined in advance with respect to said second image, and said second object line; and
   said object control processing component controls said rotation mechanism on the basis of said second differential angle.

5. The object control system according to claim 4, further comprising a decision processing component that makes a decision as to whether or not said first reference mark is included within said first image; and wherein, if said first reference mark is not included within said first image, said object control processing component controls said rotation mechanism on the basis of said second differential angle.

6. The object control system according to claim 4, further comprising a decision processing component that makes a decision as to whether or not said first reference mark is included within said first image; and wherein, if said first reference mark is not included within said first image, said object control processing component controls said rotation mechanism on the basis of said second differential angle so that said first reference mark is included within said first image.

7. The object control system according to claim 4, further comprising a weighting memory storage that stores respective weightings for said first image capturing device and said second image capturing device; and wherein, for said first differential angle and said second differential angle, a weighting for said first image capturing device and a weighting for said second image capturing device are respectively assigned, and said rotation mechanism is controlled on the basis of said first differential angle and said second differential angle to which said respective weightings have been assigned.

8. The object control system according to claim 7, wherein:
said object control processing component further controls a parallel shifting mechanism that shifts said object parallel to itself, and said object control processing component:
specifies a first parallel shift amount for said object on the basis of said first reference mark and a first target reference mark that is determined in advance for said first image;
specifies a second parallel shift amount for said object on the basis of said second image and a second target reference mark that is determined in advance with respect to said second image;
assigns a weight to said first image capturing device and a weight to said second image capturing device for said first parallel shift amount and said second parallel shift amount, respectively; and
controls said parallel shifting mechanism on the basis of said first parallel shift amount and said second parallel shift amount to which said respective weightings have been assigned.

9. The object control system according to claim 7, wherein the resolving powers of said first image capturing device and said second image capturing device are different, and said weighting storage unit stores respective weightings for said first image capturing device and said second image capturing device, so that the one thereof whose resolving power is the higher has a higher weighting value than the one thereof whose resolving power is the lower.

10. The object control system according to claim 9, wherein said first image capturing device and said second image capturing device have different resolving powers due to having different resolutions.

11. The object control system according to claim 9, wherein said first image capturing device and said second image capturing device have different resolving powers due to having different image capture ranges.

12. An object control method, comprising:
a step of acquiring a first image captured by a first image capturing device, including a first reference mark that specifies a first object line determined in advance with respect to an object;
a step of, on the basis of said first reference mark within said first image, acquiring a first differential angle that specifies the angle between a first target object line, determined in advance with respect to said first image, and said first object line;
a step of controlling a rotation mechanism to rotate said object on the basis of said first differential angle;
a step of specifying a rotational center position of the rotation mechanism that rotates the holding member, the step of specifying comprising:
a first step of specifying a first rotational center position of said rotation mechanism on the basis of positions of a first mark that is determined with respect to said holding member, included in said images before said holding member is rotated by said rotation mechanism and after that rotation;
a second step of determining, on the basis of said first rotational center position, a set rotational center position that is closer to the image capturing range of said first image capturing unit than said first rotational center position, and that specifies a second rotational center position of said rotation mechanism on the basis of positions of a second mark that is determined with respect to said holding member, included in said images before said holding member is rotated by said rotation mechanism around said position of the set rotational center and after that rotation; and
a third step of correcting said first rotational center position on the basis of said set rotational center position and said second rotational center position;
a step of controlling said rotation mechanism on the basis of said corrected position of the first rotational center.

13. A non-transitory computer-readable medium carrying out program instructions according to the object control method of claim 12.

14. The object control method according to claim 12 further comprising a weighting memory storage that stores respective weightings for said first image capturing device; and wherein, for said first differential angle, a weighting for said first image capturing device is assigned, and said rotation mechanism is controlled on the basis of said first differential angle to which said respective weighting has been assigned.

15. The object control method according to claim 14 further comprising:
specifying a first parallel shift amount for said object on the basis of said first reference mark and a first target reference mark that is determined in advance e for said first image;
assigning a weight to said first image capturing unit for said first parallel shirt amount; and
controlling a parallel shifting mechanism on the basis of said first parallel shift amount to which said respective weighting has been assigned.

* * * * *